United States Patent
Miyagawa et al.

(10) Patent No.: US 8,871,114 B2
(45) Date of Patent: Oct. 28, 2014

(54) PHOSPHOR COMPOSITIONS AND METHODS OF MAKING THE SAME

(75) Inventors: Hiroaki Miyagawa, Oceanside, CA (US); Bin Zhang, San Diego, CA (US); James Chienchung Shih, Artesia, CA (US)

(73) Assignee: Nitto Denko Corporation, Osaka (JP)

( * ) Notice: Subject to any disclaimer, the term of this patent is extended or adjusted under 35 U.S.C. 154(b) by 128 days.

(21) Appl. No.: 13/586,677

(22) Filed: Aug. 15, 2012

(65) Prior Publication Data

US 2013/0069007 A1 Mar. 21, 2013

Related U.S. Application Data

(60) Provisional application No. 61/524,278, filed on Aug. 16, 2011.

(51) Int. Cl.
*C09K 11/77* (2006.01)
*H05B 33/14* (2006.01)

(52) U.S. Cl.
CPC ......... *C09K 11/7721* (2013.01); *C09K 11/7774* (2013.01); *H05B 33/14* (2013.01)
USPC ............. 252/301.4 R; 264/21; 264/1.22; 501/152; 501/153; 313/503; 313/486; 257/98; 252/301.4 H; 252/301.4 F; 252/301.6 F; 252/301.6 R

(58) Field of Classification Search
USPC ............. 252/301.4 R; 264/21, 1.22; 501/152, 501/153; 313/503, 486; 257/98
See application file for complete search history.

(56) References Cited

U.S. PATENT DOCUMENTS

| | | | |
|---|---|---|---|
| 7,514,721 B2 | 4/2009 | Krames et al. | |
| 8,029,595 B2 | 10/2011 | Mukherjee et al. | |
| 8,169,136 B2 | 5/2012 | Nakamura et al. | |
| 8,410,446 B2 * | 4/2013 | Nakamura et al. | 250/361 R |
| 2005/0276995 A1 | 12/2005 | Kondo et al. | |
| 2009/0108507 A1 | 4/2009 | Messing et al. | |
| 2010/0012478 A1 | 1/2010 | Nakamura et al. | |
| 2010/0059681 A1 * | 3/2010 | Nakamura et al. | 250/361 R |
| 2011/0227477 A1 | 9/2011 | Zhang et al. | |
| 2013/0043430 A1 * | 2/2013 | Nakamura et al. | 252/301.4 R |

FOREIGN PATENT DOCUMENTS

| | | | |
|---|---|---|---|
| JP | 2008-24739 | * | 2/2008 |
| JP | 2011-153200 | * | 8/2011 |
| WO | WO 2008/093869 | * | 8/2008 |
| WO | WO 2009/105581 A1 | | 8/2009 |
| WO | WO 2012/057133 | * | 5/2012 |
| WO | WO 2013/025713 | | 2/2013 |

OTHER PUBLICATIONS

Kaczmarek, Slawomir, et al., "Changes in optical properties of YAG:Ce single crystals due to codoping and ionizing radiation treatment," Proceedings of SPIE, Mar. 24, 1999, pp. 339-345.
Lupei, V., "$RE^{3+}$ emission in garnets: multisites, energy transfer and quantum efficiency," Optical Materials 19 (2002) pp. 95-107.
Ropp, R.C., "Luminescence and the Solid State," $2^{nd}$ Edition, Studies in Inorganic Chemistry 21, Chapter 6.1-6.8, Design of Phosphors, 2004, pp. 447-614.
Van Schaik, W., et al., "Influence of Defects on the Luminescence Quantum Yield of $Y_{1.94}Eu_{0.06}O_3$," Chem. Mater. 1992, 4, 410-415.
Matsui,Yoshikazu, et al., "Preparation of YAG: Ce nanocrystals by an environmentally friendly wet process Effect of $Ce^{3+}$ concentration on photoluminescent property," Journal of Ceramic Processing Research, Jun. 2011, vol. 2, No. 3, pp. 348-352.
PCT International Search Report and Written Opinion received in PCT/US2012/050789, mailed Oct. 24, 2012.
International Preliminary Report on Patentability in PCT Application No. PCT/US2012/050789 dated Feb. 27, 2014.
Langley et al., "Lattice Parameters and Ionic Radii of the Oxide and Fluoride Garnets," Journal of Solid State Chemistry, Oct. 1979, vol. 30, No. 1, pp. 79-82.

* cited by examiner

*Primary Examiner* — Carol M Koslow
(74) *Attorney, Agent, or Firm* — Knobbe, Martens, Olson & Bear, LLP

(57) ABSTRACT

Disclosed herein are emissive ceramic elements having low amounts of certain trace elements. Applicants have surprisingly found that a lower internal quantum efficiency (IQE) may be attributed to specific trace elements that, even at very low amounts (e.g., 50 ppm or less), can cause significant deleterious effects on IQE. In some embodiments, the emissive ceramic element includes a garnet host material and an amount of Ce dopant. The emissive ceramic element may, in some embodiments, have an amount of Na in the composition less than about 67 ppm, an amount of Mg in the composition less than about 23 ppm, or an amount of Fe in the composition less than about 21 ppm.

23 Claims, 7 Drawing Sheets

PHOSPHOR COMPOSITIONS AND METHODS OF MAKING THE SAME

CROSS-REFERENCE TO RELATED APPLICATIONS

This application claims the benefit of priority to U.S. Application No. 61/524,278, filed Aug. 16, 2011, which is hereby incorporated by reference in its entirety.

BACKGROUND

1. Field

The present application relates to emissive ceramic materials having low amounts of specific trace elements.

2. Description of the Related Art

Solid state light emitting devices such as light emitting diode (LED), organic light emitting diode (OLED) or sometimes called organic electroluminescent device (OEL), and inorganic electroluminescent device (IEL) have been widely utilized for various applications such as flat panel display, indicator for various instrument, signboard, and ornamental illumination, etc. As the emission efficiency of these light emitting devices continues to improve, applications that require much higher luminance intensity, such as automobile headlights and general lighting, may soon become feasible. For these applications, white-LED is one of the promising candidates and have attracted much attention.

Internal quantum efficiency (IQE) is the ratio of photons created by an emissive material to the photons absorbed by the same material. An increased IQE value can improve a lighting apparatus's energy efficiency; however, it can be difficult to reliably obtain phosphors with a high IQE.

SUMMARY

Some embodiments disclosed herein include an emissive composition having low amounts of specific elements. In some embodiments, the composition includes a garnet host material and an amount of Ce dopant effective to produce luminescence when the emissive composition is exposed to an ultraviolet or blue radiation. In some embodiments, an amount of Na in the composition is less than about 67 ppm. In some embodiments, an amount of Mg in the composition is less than about 23 ppm. In some embodiments, an amount of Fe in the composition is less than about 21 ppm.

In some embodiments, an amount of B in the composition is less than about 9 ppm.

In some embodiments, an amount of P in the composition is less than about 113 ppm.

In some embodiments, an amount of K in the composition is less than about 54 ppm.

In some embodiments, an amount of Ti in the composition is less than about 28 ppm.

In some embodiments, an amount of Cr in the composition is less than about 2.7 ppm.

In some embodiments, an amount of Cu in the composition is less than about 1.5 ppm.

In some embodiments, an amount of Zr in the composition is less than about 1600 ppm.

In some embodiments, an amount of Sb in the composition is less than about 18 ppm;

In some embodiments, an amount of Ba in the composition is less than about 74 ppm;

In some embodiments, an amount of La in the composition is less than about 17 ppm;

In some embodiments, an amount of Sm in the composition is less than about 1.2 ppm.

In some embodiments, an amount of Dy in the composition is less than about 6.9 ppm.

In some embodiments, an amount of Ho in the composition is less than about 7.0 ppm.

In some embodiments, an amount of Pt in the composition is less than about 2.0 ppm.

In some embodiments, the garnet host material is represented by the formula: $A_3B^1_2B^2_3X_{12}$, wherein: A is selected from the group consisting of Li, K, Ag, Tl, Ca, Sr, Mn, Co, Cd, Pb, Sc, Y, Pr, Nd, Eu, Gd, Tb, Ho, Er, Tm, Yb, In, Bi, and Zr; $B^1$ is selected from Li, Ca, Mn, Co, Ni, Cu, Zn, Cd, Sc, Y, Ho, Er, Tm, Yb, Ti, V, Cr, Mn, Co, Ni, Rh, Al, Ga, In, Ti, Zr, Ru, Sn, Nb, Ta, Sb, and Te; $B^2$ is selected from the group consisting of Li, Co, Zn, Cd, Al, Ga, Ti, Si, Ge, Sn, V, Nb, and As; and X is selected from the group consisting of O and F.

In some embodiments, the garnet host material is selected from $Y_3Al_5O_{12}$, $(Y_{1-x}, Gd_x)_3(Al_{1-y}, Ga_y)_5O_{12}$, $Lu_3Al_5O_{12}$, $Tb_3Al_5O_{12}$ and $Ca_3Sc_2Si_3O_{12}$, where x is in the range from about 0.00 to about 0.50 and y is in the range from about 0.00 to about 0.50. In some embodiments, the garnet host material is $Y_3Al_5O_{12}$.

In some embodiments, the amount of Ce dopant is in the range of about 0.1 at % to about 10 at %.

In some embodiments, the composition is a sintered ceramic element.

In some embodiments, the emissive ceramic element has a thickness in the range of about 10 μm to about 1 mm.

In some embodiments, the composition is a powder.

In some embodiments, the powder is dispersed in a transparent matrix.

In some embodiments, a total amount of the garnet host material and Ce dopant is at least about 90% by weight of the emissive ceramic element.

In some embodiments, the emissive ceramic element has an internal quantum efficiency (IQE) of at least about 85% when exposed to radiation having a wavelength of about 455 nm.

Some embodiments disclosed herein include a method including exposing any of the compositions disclosed in the present application to a blue or ultraviolet radiation.

Some embodiments disclosed herein include a lighting apparatus including: a light source configured to emit blue or ultraviolet radiation; and any of the compositions disclosed in the present application, wherein the composition is configured to receive at a least a portion of the blue or ultraviolet radiation.

Some embodiments disclosed herein include a method of making an emissive ceramic element including sintering a composition having a garnet host material, or stoichiometric precursors thereof, and Ce-dopant or a precursor thereof, wherein the composition includes low amounts of certain elements. In some embodiments, an amount of Na in the composition is less than about 67 ppm. In some embodiments, an amount of Mg in the composition is less than about 23 ppm. In some embodiments, an amount of Fe in the composition is less than about 21 ppm.

In some embodiments, an amount of B in the composition is less than about 9 ppm.

In some embodiments, an amount of P in the composition is less than about 113 ppm.

In some embodiments, an amount of K in the composition is less than about 54 ppm.

In some embodiments, an amount of Ti in the composition is less than about 28 ppm.

In some embodiments, an amount of Cr in the composition is less than about 2.7 ppm.

In some embodiments, an amount of Cu in the composition is less than about 1.5 ppm.

In some embodiments, an amount of Zr in the composition is less than about 1600 ppm.

In some embodiments, an amount of Sb in the composition is less than about 18 ppm.

In some embodiments, an amount of Ba in the composition is less than about 74 ppm.

In some embodiments, an amount of La in the composition is less than about 17 ppm.

In some embodiments, an amount of Sm in the composition is less than about 1.2 ppm.

In some embodiments, an amount of Dy in the composition is less than about 6.9 ppm.

In some embodiments, an amount of Ho in the composition is less than about 7.0 ppm.

In some embodiments, an amount of Pt in the composition is less than about 2.0 ppm.

In some embodiments, the composition includes: a first precursor of the garnet host material selected from the group consisting of yttrium nitrate, yttrium oxide, and combinations thereof; and a second precursor of the garnet host material selected from the group consisting of aluminum oxide, aluminum nitrate, and combinations thereof.

In some embodiments, the composition includes cerium nitrate or cerium oxide.

In some embodiments, the composition comprises a garnet host material selected from the group consisting of $Y_3Al_5O_{12}$, $(Y, Gd)_3(Al, Ga)_5O_{12}$, $Lu_3Al_5O_{12}$, $Tb_3Al_5O_{12}$ and $Ca_3Sc_2Si_3O_{12}$.

Some embodiments disclosed herein include an emissive composition having a garnet host material and an amount of Ce dopant effective to produce luminescence when the emissive composition is exposed to an ultraviolet or blue radiation. In some embodiments, an amount of Na in the composition is less than about 67 ppm; an amount of Mg in the composition is less than about 23 ppm; an amount of Fe in the composition is less than about 21 ppm; an amount of B in the composition is less than about 9 ppm; an amount of P in the composition is less than about 113 ppm; an amount of K in the composition is less than about 54 ppm; an amount of Ti in the composition is less than about 28 ppm; an amount of Cr in the composition is less than about 2.7 ppm; an amount of Cu in the composition is less than about 1.5 ppm; an amount of Zr in the composition is less than about 1600 ppm; an amount of Sb in the composition is less than about 18 ppm; an amount of Ba in the composition is less than about 74 ppm; an amount of La in the composition is less than about 17 ppm; an amount of Sm in the composition is less than about 1.2 ppm; an amount of Dy in the composition is less than about 6.9 ppm; an amount of Ho in the composition is less than about 7.0 ppm; and an amount of Pt in the composition is less than about 2.0 ppm.

DETAILED DESCRIPTION

Figure 1:
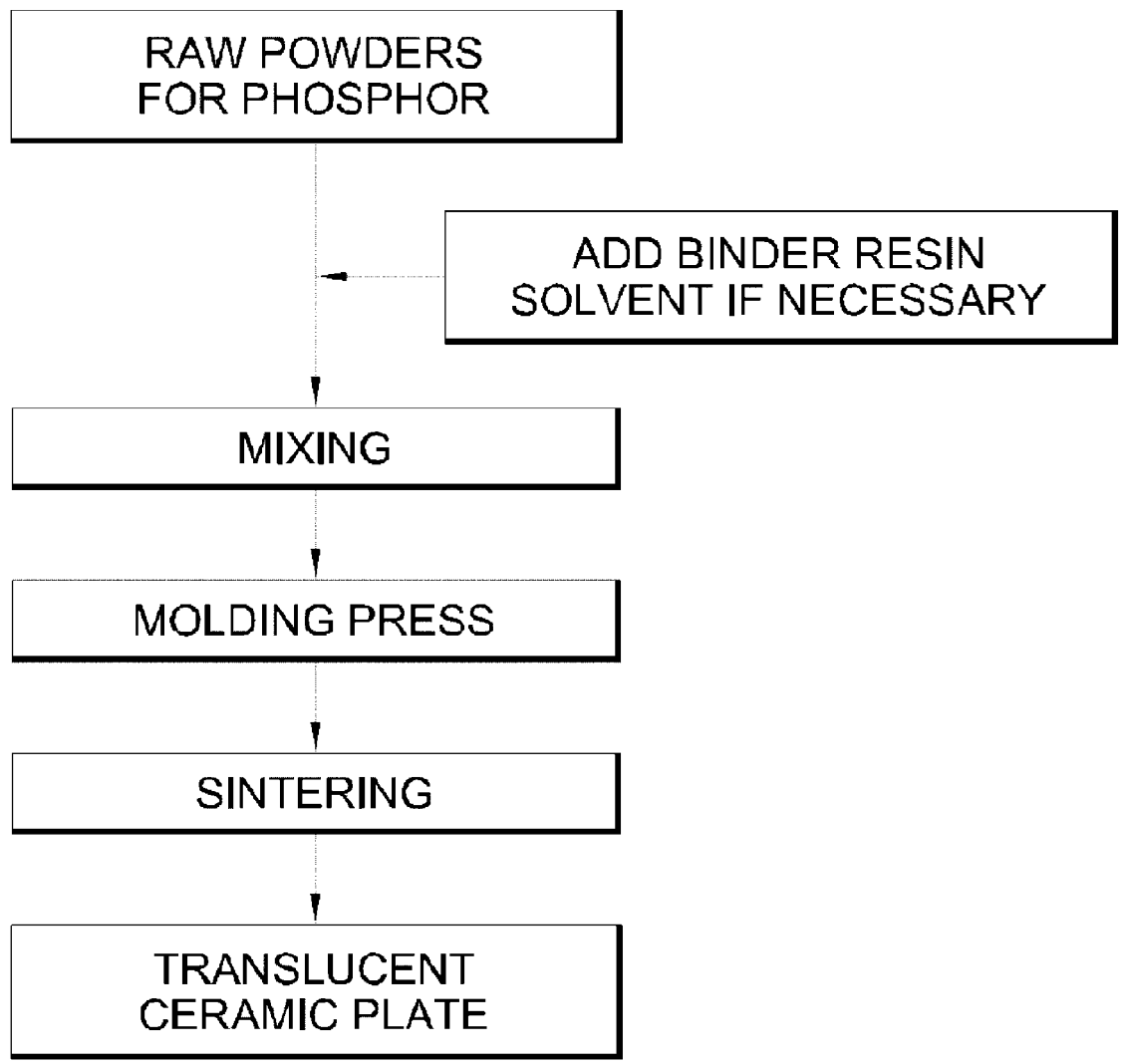
FIG. 1 shows a preparation flow diagram one embodiment of forming the emissive ceramic element by molding and sintering.

The ability to consistently produce emissive ceramic materials with high internal quantum efficiencies can be a challenging endeavor. Sometimes for unknown reasons the IQE can be substantially lower for emissive ceramic materials despite that they are ostensibly produced under the same conditions as emissive ceramic materials with a higher IQE. Applicants have surprisingly found that a lower IQE may be attributed to specific trace elements that, even at very low amounts (e.g., 50 ppm or less), can cause significant deleterious effects on IQE. Accordingly, disclosed herein are emissive ceramic materials having low amounts of specific trace elements that were identified by the Applicants as decreasing IQE.

Some embodiments disclosed herein include a composition having a garnet host material and an amount of Ce dopant. The composition can be, for example, an emissive sintered ceramic or an emissive powder disposed in a transparent matrix. The amount of Ce dopant can be effective to produce luminescence when the emissive composition is exposed to an ultraviolet or blue radiation. In some embodiments, the amount of Ce dopant can produce luminescence when the emissive composition is exposed to light having a wavelength between about 400 nm to about 500 nm. In some embodiments, the amount of Ce dopant can produce luminescence when the emissive composition is exposed to light having a wavelength between about 435 nm to about 475 nm. In some embodiments, the amount of Ce dopant can produce luminescence when the emissive composition is exposed to light having a wavelength between about 440 nm to about 470 nm. For example, the amount of Ce dopant can produce luminescence when the emissive composition is exposed to light having a wavelength of about 455 nm.

The emissive composition may, in some embodiments, have less than about 67 ppm of Na; less than about 23 ppm of Mg; and less than about 21 ppm of Fe. In some embodiments, the emissive composition has less than 9 ppm of B. In some embodiments, the emissive composition has less than about 113 ppm of P. In some embodiments, the emissive composition has less than about 54 ppm of K. In some embodiments, the emissive composition has less than about 28 ppm of Ti. In some embodiments, the emissive composition has less than about 2.7 ppm of Cr. In some embodiments, the emissive composition has less than about 1.5 ppm of Cu. In some embodiments, the emissive composition has less than about 1600 ppm of Zr. In some embodiments, the emissive composition has less than about 18 ppm of Sb. In some embodiments, the emissive composition has less than about 74 ppm of Ba. In some embodiments, the emissive composition has less than about 17 ppm of La. In some embodiments, the emissive composition has less than about 1.2 ppm of Sm. In some embodiments, the emissive composition has less than about 6.9 ppm of Dy. In some embodiments, the emissive composition has less than about 7.0 ppm of Ho. In some embodiments, the emissive composition has less than about 2.0 ppm of Pt.

In some embodiments, the emissive composition has less than about 60 ppm of Na. In some embodiments, the emissive composition has less than about 17 ppm of Mg. In some embodiments, the emissive composition has less than about 4 ppm of Fe.

The composition can be prepared, for example, by sintering an assembly to form an emissive element. Therefore, an "emissive element" or "emissive ceramic element" generally describes the final emissive material that can be used for lighting purposes, while an "assembly" is a composite that may be sintered to form the emissive ceramic. As will be discussed further below, the amount of trace elements found in the emissive ceramic element can be controlled based on the materials used for preparing the assembly. The composition may also be, for example, a powder. In some embodiments, the powder is prepared by conventional means, such as flow-based thermochemical synthetic routes (e.g., laser pyrolysis, flame spray, spray pyrolysis and plasma synthesis). Similarly, the amount of trace elements found in the powders can be controlled based on the starting materials for the process.

The garnet host material in the emissive composition is not particularly limited, provided that the garnet host material does not include significant amounts of metals that diminish IQE (e.g., Na, Mg, and Fe). In some embodiments, the emissive composition comprises a phosphor. In view of the present disclosure, the skilled artisan would be able to select the types of phosphors for the emissive composition based on several factors, e.g., for the desired white point (i.e., color temperature) by taking the absorption and emission spectra of different types of phosphors into consideration. In some embodiments, the garnet host material can be represented by the formula $A_3B^1_2B^2_3X_{12}$. A can be described as the dodecahedral coordination site, $B^1$ can be described as the octahedral coordination site, and $B^2$ can be described as the tetrahedral site. See for example, Lattice Parameters and Ionic Radii of the Oxide and Fluoride Garnets, Langley, Richard, et al, J. of Solid State Chemistry (30):79-82 (1979), which is incorporated by reference in its entirety herein.

A can be, for example, Li, K, Ag, Tl, Ca, Sr, Mn, Co, Cd, Pb, Sc, Y, Pr, Nd, Eu, Gd, Tb, Ho, Er, Tm, Yb, In, Bi, or Zr. $B^1$ can be, for example, Li, Ca, Mn, Co, Ni, Cu, Zn, Cd, Sc, Y, Ho, Er, Tm, Yb, Ti, V, Cr, Mn, Co, Ni, Rh, Al, Ga, In, Ti, Zr, Ru, Sn, Nb, Ta, Sb, or Te. $B^2$ can be, for example, Li, Co, Zn, Cd, Al, Ga, Ti, Si, Ge, Sn, V, Nb, or As. X can be O or F. In some embodiments, A is Y or Tb. In some embodiment, A is Y. In some embodiments, $B^1$ and $B^2$ are the same. In some embodiments, $B^1$ is Al. In some embodiments, $B^2$ is Al. In some embodiments, X is O.

The garnet host material can be, in some embodiments, $Y_3Al_5O_{12}$, $(Y_{1-x}Gd_x)_3(Al_{1-y}, Ga_y)_5O_{12}$, $Lu_3Al_5O_{12}$, $(Tb_{1-x}, Gd_x)_3(Al_{1-y}, Ga_y)_5O_{12}$, or $Ca_3Sc_2Si_3O_{12}$, where x is in the range from about 0.00 to about 0.50 and y is in the range from about 0.00 to about 0.50. In some embodiments, the garnet host material is $Y_3Al_5O_{12}$.

In some embodiments, the garnet may have a composition $A_3B_5O_{12}$, wherein A and B are independently selected from trivalent metals. In some embodiments, A can be selected from elements including but not limited to: Y, Gd, La, Lu, and Tb; B can be selected from elements including but not limited to: Al, Ga, Si, and In. In some embodiments, the garnet is doped with at least one element preferably a rare earth metal.

In some embodiments, the rare earth metal is Ce. Non-limiting examples of useful phosphors include $Y_3Al_5O_{12}$:Ce, $(Y, Tb)_3Al_5O_{12}$:Ce, and $(Y, Gd)_3(Al, Ga)_5O_{12}$:Ce. In some embodiments, the emissive composition comprises RF thermal plasma synthesized $Y_3Al_5O_{12}$:Ce$^{3+}$ (YAG:Ce). In some embodiments, the emissive composition comprises $(Y_{1-x-y}, Gd_x, Ce_y)_3Al_5O_{12}$, wherein $0 \leq x < 0.50$; and $0 < y < 0.05$. In some embodiments, the emissive composition comprises $(Y_{1-x-y}, Gd_x, Ce_y)_3Al_5O_{12}$, wherein $0 \leq x < 0.45$; and $0 < y < 0.045$. In some embodiments, the ceramic layer comprises $(Y_{1-x-y}, Gd_x, Ce_y)_3Al_5O_{12}$, wherein $0 \leq x < 0.40$; and $0 < y < 0.04$. In some embodiments the ceramic layer includes $(Y_{0.64}Gd_{0.35}Ce_{0.01})_3Al_5O_{12}$, $(Y_{0.64}Gd_{0.35}Ce_{0.004})_3Al_5O_{12}$, or $(Y_{0.64}Gd_{0.35}Ce_{0.002})_3Al_5O_{12}$ The amount of Ce dopant in the emissive composition can also vary. The skilled artisan can readily determine amounts of Ce dopant that produces luminescence when the emissive composition is exposed to an ultraviolet or blue radiation. In some embodiments, the amount of Ce dopant is in the range of about 0.01 at % to about 10 at %. The amount of Ce dopant can be, for example, at least about 0.02 at %; at least about 0.04 at %; at least about 0.05 at %; at least about 0.075 at %; or at least about 0.1 at %. The amount of Ce dopant can be, for example, no more than about 10 at %; no more than about 5 at %; no more than about 2 at %.

In embodiments where the composition is an emissive ceramic element, the thickness of the emissive element may be adjusted, for example, by the size of an assembly that is sintered to obtain the emissive ceramic element. In some embodiments, the thickness of the emissive element is in the range of about 5 μm to about 1 mm. The thickness of the emissive ceramic element may, for example, be at least about 10 μm; at least about 15 μm; or at least about 20 μm. The thickness of the emissive ceramic element may, for example, be no more than about 1 mm; no more than about 900 μm; no more than about 800 μm; no more than about 750 μm; no more than about 600 μm; no more than about 500 μm.

In some embodiments, a total amount of the garnet host material and Ce dopant is at least about 90% by weight of the emissive composition. In some embodiments, a total amount of the garnet host material and Ce dopant is at least about 95% by weight of the emissive composition. In some embodiments, a total amount of the garnet host material and Ce dopant is at least about 97% by weight of the emissive composition. In some embodiments, a total amount of the garnet host material and Ce dopant is at least about 99% by weight of the emissive composition.

The emissive composition may also optionally include low amounts of various other trace elements (e.g., B, K, Ti, Cr, Cu, Ba, Zr, La, Sm, P, Dy, Ho, and/or Pt). Although various trace elements may be preferably below certain thresholds, the present application is not limited to emissive composition with low amounts of these various trace elements. In some embodiments, the emissive composition will have an amount greater than the thresholds described for the various trace elements, such as B, K, Ti, Cr, Cu, Ba, Zr, La, Sm, P, Dy, Ho, and Pt In some embodiments, the emissive composition has less than about 11 ppm of Fe. In some embodiments, the emissive composition has less than about 4 ppm of Fe. In some embodiments, the emissive composition has less than about 14 ppm of Na. In some embodiments, the emissive composition has less than about 10 ppm of Mg. In some embodiments, the emissive composition has less than about 3 ppm of Mg. In some embodiments, the emissive composition has less than about 5 ppm of B. In some embodiments, the emissive composition has less than about 20 ppm of P. In some embodiments, the emissive composition has less than 25 ppm of K. In some embodiments, the emissive composition has less than about 3 ppm of Ti. In some embodiments, the emissive composition has less than about 1 ppm of Cr. In some embodiments, the emissive composition has less than about 500 ppm of Zr. In some embodiments, the emissive composition has less than about 2 ppm of Sb. In some embodiments, the emissive composition has less than about 5 ppm of Ba. In some embodiments, the emissive composition has less than about 2 ppm of La. In some embodiments, the emissive composition has less than 4 ppm of Dy. In some embodiments, the emissive composition has less than 3 ppm of Ho.

The emissive compositions may, in some embodiments, include various elements that Applicants have discovered do not significantly diminish quantum efficiencies. In some embodiments, the emissive composition includes at least about 0.4 ppm of Ga. In some embodiments, the emissive composition includes at least about 40 ppm of Ca. In some embodiments, the emissive composition includes at least about 20 ppm of Mo. In some embodiments, the emissive composition includes at least about 0.7 ppm of Se. In some embodiments, the emissive composition includes at least about 0.8 ppm of Zn. In some embodiments, the emissive composition includes at least about 20 ppm of Eu. In some embodiments, the emissive composition includes at least about 90 ppm of Eu. In some embodiments, the emissive composition includes at least about 5 ppm of Tb. In some embodiments, the emissive composition includes at least about 5 ppm of Lu. In some embodiments, the emissive composition includes at least about 15 ppm of Hf. In some embodiments, the emissive composition includes at least about 15 ppm of W. The composition may include two or more of these elements that do not significantly diminish quantum efficiency at the above-recited amounts.

As disclosed above, one advantage of the emissive compositions disclosed herein is that they may exhibit superior internal quantum efficiencies. In some embodiments, the emissive composition exhibits an internal quantum efficiency (IQE) of at least about 85% when exposed to radiation having a wavelength of about 455 nm. In some embodiments, the emissive composition exhibits an internal quantum efficiency (IQE) of at least about 87% when exposed to radiation having a wavelength of about 455 nm. In some embodiments, the emissive composition exhibits an internal quantum efficiency (IQE) of at least about 89% when exposed to radiation having a wavelength of about 455 nm. In some embodiments, the emissive composition exhibits an internal quantum efficiency (IQE) of at least about 90% when exposed to radiation having a wavelength of about 455 nm. In some embodiments, the emissive composition exhibits an internal quantum efficiency (IQE) of at least about 93% when exposed to radiation having a wavelength of about 455 nm. In some embodiments, the emissive composition exhibits an internal quantum efficiency (IQE) of at least about 95% when exposed to radiation having a wavelength of about 455 nm. In some embodiments, the emissive composition exhibits an internal quantum efficiency (IQE) of at least about 97% when exposed to radiation having a wavelength of about 455 nm. In some embodiments, the emissive composition exhibits an internal quantum efficiency (IQE) of at least about 98% when exposed to radiation having a wavelength of about 455 nm.

The emissive elements can be prepared using standard methods known to those skilled in the art. For example, the emissive element may be formed by laminating and sintering two or more cast tapes. Examples and methods of laminating and sintering two or more cast tapes are disclosed in U.S. Pat. No. 7,514,721 and U.S. Publication No. 2009/0108507, both of which are hereby incorporated by reference in their entirety. As another example, the emissive element may be prepared by molding and sintering phosphor mixtures. Non-limiting examples of these procedures are disclosed in U.S. Publication No. 2009/0212697 and U.S. application Ser. No. 13/050,746 (published as US 2011/0227477), both of which are hereby incorporated by reference in their entirety. The sintered ceramic element may be polycrystalline. The emissive elements of the present application may, in some embodiments, be obtained using raw materials having low amounts of the trace elements described above.

The emissive elements may be prepared by molding and sintering phosphor mixtures. Examples of emissive elements and methods of making the same are disclosed U.S. Publication No. 2009/0212697, which is hereby incorporated by reference in its entirety. FIG. 1 shows a preparation flow diagram for one embodiment of forming the composite by molding and sintering.

First, raw garnet phosphor powders are provided, such as the first garnet phosphor and the second garnet phosphor described herein. The raw powders may be prepared using any conventional or suitable methods, such as the flow-based thermochemical synthetic routes described herein. In some embodiments, raw powders of phosphor materials used to make the composite are typically nano-sized particles with average particle size no greater than about 1000 nm, preferably no greater than about 500 nm, more preferably no greater than 200 nm. If the particle size is greater than about 1000 nm, it can be very difficult to make total light transmittance higher than about 50%, because such large particles do not easily fuse with each other even at a high temperature and high pressure sintering condition. The result would be a tendency for a lot of air voids to remain in the ceramic plate. On the other hand, nano-sized particles can easily fuse with each other, which enable us to prepare fine and air void free ceramic plates.

The raw materials are not required to have the same composition or crystal structure of resultant phosphor ceramic plate. For example, a YAG:Ce emissive element may be made by using YAG:Ce powders, Y—Al—O—Ce containing amorphous powders, a mixture of $YAlO_3$:Ce and $Al_2O_3$ powders, a mixture of $Y_2O_3$, $Al_2O_3$, and $CeO_2$ powders, and any combination thereof.

In some embodiments, small quantities of flux materials (e.g., sintering aids) may be used in order to improve sintering properties if desired. In some embodiments, the sintering aids may include, but are not limited to, tetraethyl orthosilicate (TEOS), colloidal silica, lithium oxide, titanium oxide, zirconium oxide, magnesium oxide, barium oxide, calcium oxide, strontium oxide, boron oxide, or calcium fluoride. Additional sintering aids include, but are not limited to, alkali metal halides such as NaCl or KCl, and organic compounds such as urea. In some embodiments, the sintered ceramic plate comprises between about 0.01% and about 5%, between about 0.05% and about 5%, between about 0.1% and about 4%, or between about 0.3% and about 1% by weight of the flux material(s) or sintering aid(s). The sintering aid can be intermixed with the raw materials. For example, in some embodiments, tetraethyl orthosilicate (TEOS) can be added to the raw materials to provide the desired amount of sintering aid. In one embodiment, about 0.05% to about 5% by weight of TEOS is provided to the emissive element. In some embodiments, the amount of TEOS may be between about 0.3% and about 1% by weight.

Various plasticizers may also be included, in some embodiments, to reduce the glass transition temperature and/or improve flexibility of the ceramic. Non-limiting examples of plasticizers include dicarboxylic/tricarboxylic ester-based plasticizers, such as bis(2-ethylhexyl)phthalate, diisononyl phthalate, bis(n-butyl)phthalate, butyl benzyl phthalate, diisodecyl phthalate, di-n-octyl phthalate, diisooctyl phthalate, diethyl phthalate, diisobutyl phthalate, and di-n-hexyl phthalate; adipate-based plasticizers, such as bis(2-ethylhexyl)adipate, dimethyl adipate, monomethyl adipate, and dioctyl adipate; sebacate-based plasticizers, such as dibutyl sebacate, and maleate; dibutyl maleate; diisobutyl maleate; polyalkylene glycols such as polyethylene glycol, polypropylene glycol, and copolymers thereof; benzoates; epoxidized vegetable oils; sulfonamides, such as N-ethyl toluene sulfonamide, N-(2-hydroxypropyl)benzene sulfonamide, and N-(n-butyl)benzene sulfonamide; organophosphates, such as tricresyl phosphate, tributyl phosphate; glycols/polyethers, such as triethylene glycol dihexanoate, tetraethylene glycol diheptanoate; alkyl citrates, such as triethyl citrate, acetyl triethyl citrate, tributyl citrate, acetyl tributyl citrate, trioctyl citrate, acetyl trioctyl citrate, trihexyl citrate, acetyl trihexyl citrate, butyryl trihexyl citrate, and trimethyl citrate; alkyl sulphonic acid phenyl ester; and mixtures thereof.

In some embodiments, the mixing and molding process may be made easier by occasionally adding binder resin and solvent to the raw powders. A binder is any substance that improves adhesion of the particles of the composition being heated to form a composite. Some non-limiting examples of binders include polyvinyl alcohol, polyvinyl acetate, polyvinyl chloride, polyvinyl butyral, polystyrene, polyethylene glycol, polyvinylpyrrolidones, polyvinyl acetates, polyvinyl butyrates, other water soluble polymers, etc. In some, but not all, circumstances, it may be useful for the binder to be sufficiently volatile that it can be completely removed or eliminated from the precursor mixture during the sintering phase. Solvents which may be used in include, but not limited to water, a lower alkanol such as but not limited to denatured ethanol, methanol, isopropyl alcohol and mixtures thereof, preferably denatured ethanol, xylenes, cyclohexanone, acetone, toluene and methyl ethyl ketone, and mixtures thereof.

The mixing process can be done using a mortar and pestle, ball milling machine, bead milling machine or other equivalent equipments. For the lamination process, a simple die for tablet molding, hot isostatic pressing (HIP), cold isostatic pressing (CIP), or roll-to-roll lamination process may be utilized. In some embodiments, controlled quantities of raw powders are loaded in a mold followed by applying pressure to form the emissive element.

A single mold, or two or more stacked molds, are used as the assembly, which is subsequently sintered to form a composite. The arrangement and numbers of the molds will determine the configuration of the final composite. The assembly is sintered at a high temperature that does not exceed the melting point of the resultant phosphor materials.

Any kind of suitable ceramic sintering techniques can be used to prepare translucent ceramic plates. In some embodiments, sintering may be carried out while applying pressure. Sintering conditions such as the temperature profile, atmosphere, pressure, and duration depend on the type of phosphor material. In some embodiments, the assembly is sintered at a temperature in the range of about 1000° C. to about 1900° C. For example for YAG, LuAG, TAG garnet materials, the assembly can be sintered at about 1650-1850° C. For example, LuSilicate garnet materials can be sintered at a lower temperature, e.g., about 1300 to about 1550° C. In some embodiments, the assembly is sintered for at least about 2 hours. In some embodiments, the assembly is sintered for no more than about 50 hours.

Figure 2:
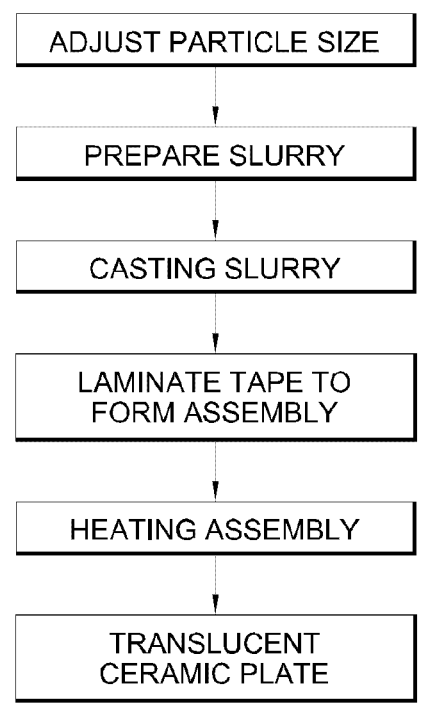
FIG. 2 shows a preparation flow diagram for one embodiment of forming the emissive ceramic that includes lamination.

The emissive element may also be formed by laminating and sintering two or more cast tapes. In some embodiments, the cast tapes will include low amounts of the trace elements described herein. Examples and methods of laminating and sintering two or more cast tapes are disclosed in U.S. Pat. No. 7,514,721 and U.S. Publication No. 2009/0108507, both of which are hereby incorporated by reference in their entirety. FIG. 2 shows a preparation flow diagram for one embodiment of forming the ceramic plate by laminating and sintering.

First, the particle size of the raw materials (e.g., nitrate or oxide based raw materials, such as $Y_2O_3$ and $Al_2O_3$ for forming YAG) may optionally be adjusted to reduce cracking in the cast tapes from capillary forces during evaporation of solvents. For example, the particle size can be adjusted by pre-annealing raw material particles to obtain the desired particle size. Raw material particles can be pre-annealed in the temperature range of about 800° C. to about 1800° C. (or more preferably 1000° C. to about 1500° C.) to obtain the desired particle size. The pre-annealing may occur in a vacuum, air, $O_2$, $H_2$, $H_2/N_2$, or a noble gas (e.g., He, Ar, Kr, Xe, Rn, or combinations thereof). In an embodiment, each of the raw materials (e.g., $Y_2O_3$ and $Al_2O_3$ for forming YAG) is adjusted to be about the same particle size. In another embodiment, the particles have a BET surface area in the range of about 0.5 $m^2/g$ to about 20 $m^2/g$ (preferably about 1.0 $m^2/g$ to about 10 $m^2/g$, or more preferably about 3.0 $m^2/g$ to about 6.0 $m^2/g$).

A slurry may then be prepared for subsequently casting into a tape. Pre-made phosphors (e.g., phosphors prepared by flow-based thermochemical synthetic routes described herein) and/or stoichiometric amounts of raw materials can be intermixed with various components to form a mixture. Examples of components for the mixture include, but are not limited to, dopants, dispersants, plasticizers, binders, sintering aids and solvents. The dopants, sintering aids, plasticizers, binders and solvents may be the same as those described above with respect to the molding and sintering process.

In some embodiments, the dispersants can be fish oil, long chain polymers, steric acid, oxidized Menhaden fish oil, dicarboxylic acids such succinic acid, orbitan monooleate, ethanedioic acid, propanedioic acid, pentanedioic acid, hexanedioic acid, heptanedioic acid, octanedioic acid, nonanedioic acid, decanedioic acid, o-phthalic acid, p-phthalic acid and mixtures thereof.

The mixture may then be subjected to comminution to form a slurry by, for example, ball milling the mixture for a time period in the range of about 0.5 hrs. to about 100 hrs. (preferably about 6 hrs. to about 48 hrs., or more preferably about 12 hrs. to about 24 hrs.). The ball milling may utilize milling balls that include materials other than the components intermixed within the mixture (e.g., the milling balls may be $ZrO_2$ for a mixture that forms YAG). In an embodiment, the ball milling includes isolating the milling balls after a period of time by filtration or other known methods of isolation. In some embodiments, the slurry has a viscosity in the range of about 10 cP to about 5000 cP (preferably about 100 cP to about 3000 cP, or more preferably about 200 cP to 1000 cP).

Third, the slurry may be cast on a releasing substrate (e.g., a silicone coated polyethylene teraphthalate substrate) to form a tape. For example, the slurry may be cast onto a moving carrier using a doctor blade and dried to form a tape. The thickness of the cast tape can be adjusted by changing the gap between the doctor blade and the moving carrier. In some embodiments, the gap between the doctor blade and the moving carrier is in the range of about 0.125 mm to about 1.25 mm (preferably about 0.25 mm to about 1.00 mm, or more preferably about 0.375 mm to about 0.75 mm). Meanwhile, the speed of the moving carrier can have a rate in the range of about 10 cm/min. to about 150 cm/min. (preferably about 30 cm/min. to about 100 cm/min., or more preferably about 40 cm/min. to about 60 cm/min.). By adjusting the moving carrier speed and the gap between the doctor blade and moving carrier, the tape can have a thickness between about 20 μm and about 300 μm. The tapes may optionally be cut into desired shapes after casting.

Two or more tapes are laminated to form an assembly. The lamination step can include stacking two or more tapes (e.g., 2 to 100 tapes are stacked) and subjecting the stacked tapes to heat and uniaxial pressure (e.g., pressure perpendicular to the tape surface). For example, the stacked tapes may be heated above the glass transition temperature ($T_g$) of the binder contained in the tape and compressed uniaxially using metal dies. In some embodiments, the uniaxial pressure is in the range of about 1 to about 500 MPa (preferably about 30 MPa to about 60 MPa). In some embodiments, the heat and pressure is applied for a time period in the range of about 1 min. to about 60 min. (preferably about 15 min. to about 45 min., or more preferably about 30 min.). The lamination step may optionally include forming various shapes (e.g., holes or pillars) or patterns into the assembly by, for example, using shaped dies.

Some embodiments of the assembly include having low amounts of the trace elements described in the present application. For example, the assembly may have less than about 67 ppm of Na; less than about 23 ppm of Mg; and less than about 21 ppm of Fe. Without being bound to any particular theory, it is believed that any trace elements in the assembly will remain in the emissive element obtained after sintering. Accordingly, maintaining low of the trace elements in the precursor materials can provide an emissive element within the scope of the present application. The thickness of the assembly may be adjusted (e.g., by adding additional layers) to vary the thickness of the emissive element.

The assembly may be heated to form the emissive element. The heating step may include a debinding process and a sintering process. The debinding process includes decomposing at least a portion of organic components within the assembly (e.g., volatilize binders and plasticizers within the assembly). As an example, the assembly may be heated in air to a temperature in the range of about 300° C. to about 1200° C. (preferably about 500° C. to about 1000° C., or more preferably about 800° C.) at a rate of about 0.1° C./min. to about 10° C./min. (preferably about 0.3° C./min. to about 5° C./min., or more preferably about 0.5° C./min. to about 1.5° C./min). This example of a heating step may also include maintaining the temperature for a time period in the range of about 30 min. to about 300 min., which may be selected based upon the thickness of the assembly.

The heating step also includes a sintering process to form the emissive element. The assembly may be sintered in a vacuum, air, $O_2$, $H_2$, $H_2/N_2$, or a noble gas (e.g., He, Ar, Kr, Xe, Rn, or combinations thereof) at a temperature in the range of about 1200° C. to about 1900° C. (preferably about 1300° C. to about 1800° C., or more preferably about 1350° C. to about 1700° C.) for a time period in the range of about 1 hr. to about 100 hrs (preferably about 2 hrs. to about 10 hrs.). In some embodiments, the debinding and sintering processes are completed in a single step.

An optional reoxidation step may also be included to improve the transmittance of the emissive element. Reoxidation can include exposing the composite to oxygen or air at a temperature in the range of about 1000° C. to about 1500° C. (preferably about 1400° C.) for a time period of about 30 min. to about 300 min. (preferably about 2 hrs.) at a heating rate of about 1° C./min. to about 20° C./min. (preferably about 4° C./min.).

The emissive composition may be prepared into a powder by conventional means, such as flow-based thermochemical synthetic routes (e.g., laser pyrolysis, flame spray, spray pyrolysis and plasma synthesis). As an example, radio frequency inductively coupled thermal plasma synthesis includes atomizing an aqueous solution having stoichiometric amounts of nitrate based raw materials, and then using a radio frequency plasma torch to evaporate and decompose the precursor materials. These materials nucleate into particles, which may be isolated (e.g., using an appropriate filter), and annealed (e.g., in a furnace at 1000° C. or more) to convert material to the desired phosphor. Methods for producing nanoparticles using a radio frequency plasma torch are disclosed in U.S. application Ser. No. 12/175,389 (published as US 2010/0012478), entitled "Thermal Treatment for Inorganic Materials," and U.S. application Ser. No. 12/131,844 (issued as U.S. Pat. No. 8,029,595), entitled "Method and Apparatus of Producing Nanoparticles using Nebulized Droplet," both of which are hereby incorporated by reference in their entireties.

The composition may be granulated or formed into powders via comminution, such as using a mortar and pestle, ball milling machine, bead milling machine or other suitable methods. The phosphor composition may be formed into a powder having an average particle size of, for example, less than about 10 μm; less than about 200 nm; less than about 500 nm; or less than about 1000 nm in diameter.

Some embodiments provide a lighting apparatus having a light source and an emissive composition configured to receive at least a portion of the radiation emitted by the light source. The emissive composition may have low amounts of certain trace elements, such as any of those disclosed above.

The light source may, in some embodiments, be configured to emit blue radiation. The blue radiation may, for example, have a wavelength of peak emission between about 360 nm and about 500 nm. In some embodiments, the light source emits radiation having a wavelength of peak emission between about 450 nm and about 500 nm. Some embodiments include a light source that is a semiconductor LED. As an example, the light source may be an AlInGaN based single crystal semiconductor material coupled to an electric source.

Figure 3A:
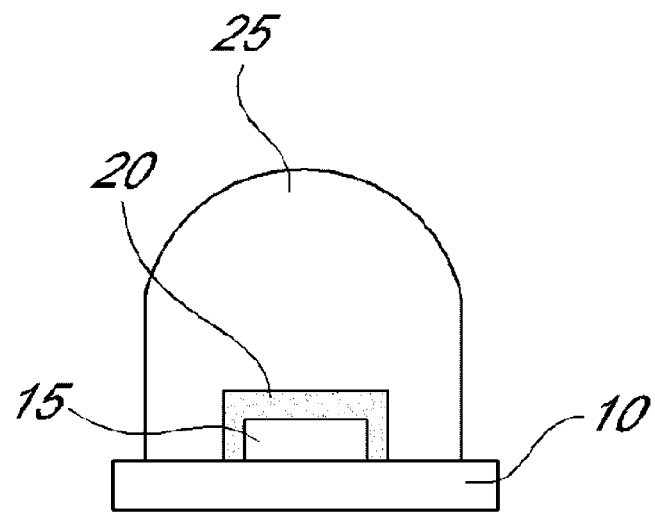
FIGS. 3A & 3B are examples of lighting apparatuses that may include the emissive compositions disclosed herein.

FIG. 3A is an example of a lighting apparatus that may include the compositions disclosed herein. A submount 10 has a light source 15, such as a conventional base LED mounted thereon. The light source 15 is adjacent to encapsulated phosphor powder 20 which receives at least a portion of the light emitted from the light source 15. An optional encapsulant resin 25, such as an epoxy, is placed over the light source 15 and the encapsulated phosphor powder 20. The encapsulated phosphor powder 20 may be any one of the compositions disclosed herein.

Figure 3B:
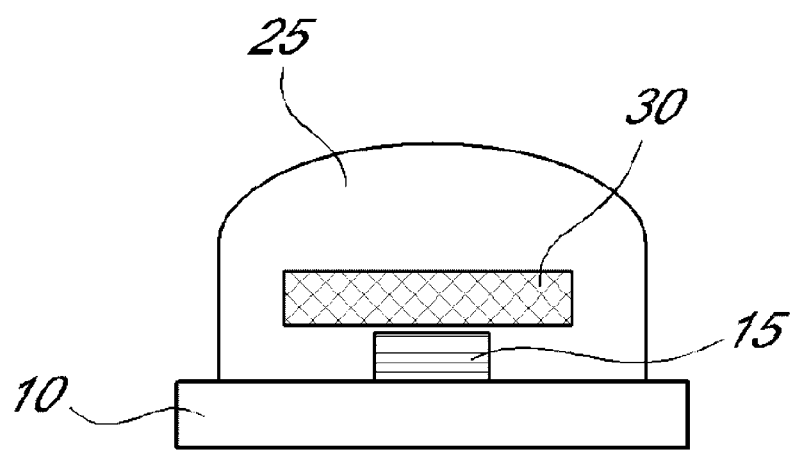

FIG. 3B is an example of a lighting apparatus that may include the emissive elements disclosed herein. The light source 15 is adjacent to emissive layer 30 which receives at least a portion of the light emitted from the light source 15. An optional encapsulant resin 25 is placed over the light source 15 and the emissive layer 30. Emissive layer 30 can include any of the emissive elements disclosed in the present application.

Some embodiments disclosed herein are methods of producing light that include exposing any of the compositions disclosed in the present application to a blue radiation. The emissive ceramic may have low amounts of certain trace elements, such as any of those disclosed above. The blue radiation may, for example, have a wavelength of peak emission between about 360 nm and about 500 nm. In some embodiments, the blue radiation has a wavelength of peak emission between about 450 nm and about 500 nm.

EXAMPLES

Additional embodiments are disclosed in further detail in the following examples, which are not in any way intended to limit the scope of the claims.

Example 1

Preparation and Evaluation of Emissive Ceramic Sample 1

0.1497 mol (57.337 g) of Yttrium (III) nitrate hexahydrate (99.9% pure, Sigma-Aldrich, St. Louis, Mo.), 0.25 mol (93.785 g) of Aluminum nitrate nonahydrate (99.97 pure, Sigma-Aldrich, St. Louis, Mo.), and 0.0003 mol (0.13 g) of Cerium (III) nitrate hexahydrate (99.99 pure, Sigma-Aldrich, St. Louis, Mo.) were dissolved in 1000 ml of deionized water, followed by ultrasonication for 30 min to prepare completely transparent solution.

This precursor solution of 0.4 M was carried into a plasma reaction chamber via an atomization probe using a liquid pump. All deposition experiments were conducted with an RF induction plasma torch (TEKNA Plasma System, Inc PL-35) operating at 3.3 MHz. For the deposition experiments, the chamber pressure was kept around 25 kPa-35 kPa, and the RF generator plate power was in the range of 10-12 kW. Both the plate power and the deposition pressure are user-controlled parameters. Argon was introduced into the plasma torch as both the swirling sheath gas and the central plasma gas via the gas inlet ports. Sheath gas flow was maintained at 30 slm (standard liters per minute), while central gas flow was 10 slm.

Reactant injection was performed using a radial atomization probe (TEKNA Plasma System, Inc SDR-772). The probe was positioned at the center of the plasma plume during reactant injection. The reactants were fed into the plasma plume at a rate of 10 ml/min during deposition. Atomization of the liquid reactant was performed with Argon as atomizing gas delivered at a flow rate of 15 slm. Cooling water supply to the atomization probe was maintained at a flow rate of 4 slm and at 1.2 MPa pressure.

Crystalline phases of the deposited particles were investigated using X-ray diffraction (XRD) spectra obtained with a Bruker AXS micro-diffractometer (CuKα). The resultant spectra were compared with standard spectra of YAG, YAP and amorphous material to identify the resulting material. Standard spectra from National Institute of Standards and Technology (NIST) standard YAG (Joint Committee on Powder Diffraction Standards [JCPDS]) card number 00-33-00400 and yttrium aluminum perovskite standard JCPDS card number 00-54-0621 were used. The crystalline phase of the obtained sample identified as mixture of amorphous and yttrium aluminum perovskite (YAP).

The average particle diameter ($D_{ave}$) was obtained from BET surface area, based on data acquired from a Micrometritics model Gemini 2365 gas sorptometer, which was measured to be 16.6 m$^2$/g. Obtained $D_{ave}$ of the sample was 65 nm based on 5.55 g/cc of the YAP density.

Before preparing a green sheet containing polymeric binder and YAG, the raw YAP/amorphous particles placed on alumina combustion boat were first heated to 600° C. in air, followed by the next heating at 1400° C. (heating rate was 4° C./min) for 2 hours in reducing ambient of $H_2/N_2=3\%/97\%$ (v/v), respectively, using GSL-1700X-80 alumina tube furnace (MTI Corporation, Richmond Calif.). These three samples turned yellow from plain white raw particles after this heat treatment at 1400° C. in $H_2/N_2$ due to crystallization to Ce-doped YAG phase. XRD also showed a single YAG phase. The average particle diameter ($D_{ave}$) of the resulted YAG particles was obtained from BET surface area which was measured to be 2.31 m$^2$/g. Obtained $D_{ave}$ of the sample was 571 nm based on 4.55 g/cc of the YAG density.

The YAG particles (64.2 g), 10.8 g of an aqueous acrylic polymer solution as a main component of polymeric binder for final green sheet, 0.12 g of 2,4,7,9-tetramethyl-5-decyne-4,7-diol ethoxylate as a de-foamer for the aqueous slurry, 1.18 g of 2-amino-2-methyl-1 propanol as a plasticizer, and 30.00 g of milli-Q water were added to an 8 oz (0.231) polypropylene (PP) thick wall jar, whose inner diameter is 80 mm (Parkway Plastics Inc., Piscataway, N.J.).

The contents in the PP jar were then shaken by hand until the mixture seemed liquid-like. 380 g $ZrO_2$ milling media of 5~10 mm diameter were added to the PP jar, and the mixture in the PP jar was milled at 96 rpm by 700 series "roller-type" jar mill (US Stoneware, East Palestine, Ohio) for about 16 hrs. Afterwards, additional 13.7 g of the same aqueous acrylic polymer solution was added to the milled solution of ceramic particles in the PP jar to finally contain 60 vol % ceramic particles in the final slurry. Then this mixture was further milled by the roller-type jar mill for about additional 4 hrs. When the entire ball milling process was completed, the resultant slurry was filtered through a syringe-aided metal screen filter with a pore size of 0.05 mm, in order to remove aggregated ceramic particles. The slurry was then cast on silicone-coated polyethylene teraphthalate substrate with an adjustable film applicator (Paul N. Gardner Company, Inc., Pompano Beach, Fla.) at a cast rate of 300 mm/min. The blade gap of the film applicator was adjusted depending on the desired green sheet thickness. The cast tape was dried at 65° C. for at least 10 min to finally obtain approximately 100 μm thick ceramic green sheet.

The dried green sheet was cut to be about 35 mm×35 mm using a razor blade. Five layers of the green sheets having the same composition were assembled. This assembly was laminated at approximately 20 MPa at about 75° C. for about 5 min using TBH-100H heating press (Sansho Industry, Japan). As a result, an approximately 35 mm×35 mm×0.5 mm laminated YAG compact was obtained.

The surface of the laminated compacts was then laser-processed to engrave a notch into the mesh-like 2.5 mm×2.5 mm cubic shape using VLS 2.30 laser engraving and cutting system (Universal Laser Systems) with 25 W $CO_2$ laser for the following ICP-MS analysis. This process for engraving a notch enabled us to more easily separate the sintered plate where desired to obtain 2 mm×2 mm ceramic pieces, after sintering.

As the next step, the polymeric binder was removed from the laminated compacts. The laminated compacts were sandwiched between $Al_2O_3$ porous cover plates with 40% nominal porosity (ESL ElectroScience, King of Prussia, Pa.), in order to avoid the warping, cambering and bending of the laminated compacts during debinding process. A plurality of green sheets was stacked between porous $Al_2O_3$ cover plates alternatively. The laminated compacts were heated to about 1200° C. for about 2 hours in air using a ST-1700C-445 box furnace (SentroTech Corporation, Brea Ohio). The heating and cooling rates were <0.7° C./min and <4.0° C./min, respectively. The debinded compacts were fully sintered at 1800° C. for about 5 hours under 10$^{-3}$ Torr vacuum using a high temperature furnace whose heating elements and heat shields were made of tungsten and molybdenum. The heating rate of this sintering process was about 16.7° C./min (~400° C.), 8.0° C./min (400~1000° C.), 5.0° C. (1000~1400° C.), 3.3° C./min (1400~1500° C.), and 1.5° C./min (1500~1800° C.), whereas the cooling rate was 8.0° C./min in order to minimize cracking during sintering. The resulted YAG ceramics sintered in vacuum condition were usually brownish or dark brown in color due to the oxygen nonstoichiometry caused during sintering. The re-oxidation was conducted at 1400° C. for about 2 hours under low vacuum pressure (~20 Torr) at a heating and cooling rate of <4.0° C./min using GSL-1700X-80 bench-top single zone tube furnace (MTI Corporation).

IQE measurements were performed with an Otsuka Electronics MCPD 7000 multi-channel photo detector system (Osaka, JPN) together with required optical components such as integrating spheres, light sources, monochromator, optical fibers, and sample holder as described below.

The YAG:Ce emissive ceramic elements constructed as described above, with a diameter of about 11 mm, were placed on a light emitting diode (LED) with peak wavelength at 455 nm with acrylic lens which had a refractive index of about 1.45. An LED with YAG:Ce was set up inside integration sphere. The YAG:Ce ceramics elements were irradiated by the LED and the optical radiation of blue LED and YAG:Ce ceramics were recorded respectively. Next, the YAG:Ce ceramics plate was removed from LED, and then the radiation of blue LED with the acrylic lens were measured.

Figure 4:
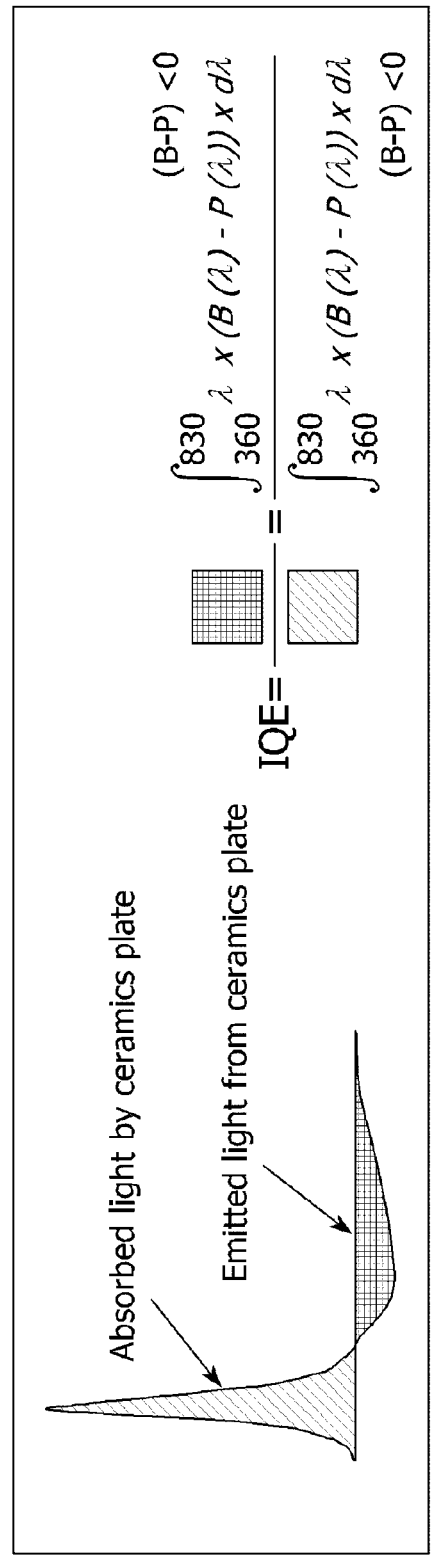
FIG. 4 is an example of how the Internal Quantum Efficiency (IQE) can be determined.

IQE was calculated by integration of the radiation difference from the blue only LED and blue LED/Ceramic combination as shown in FIG. 4.

A 50 mg sample of sintered YAG ceramics was analyzed by ICP-MS to determine the content of various elements. Using the mesh-like notch on the surface of the sintered YAG plate, the ceramic sample was broken to obtain 2 mm×2 mm YAG ceramic pieces. The YAG pieces were accurately weighed to be 50 mg. An ICP-MS sample was prepared with 50 mg weighed ceramics mixed with 3 mL nitric acid and 1 mL hydrochloric acid a pre-weighed crucible, then digested using microwave. The ceramics appeared to partially be dissolved after this microwave treatment. After cooling, the undigested ceramic pieces were dried and weighed before and after digestion to determine the amount dissolved which was used for calculation of ICP-MS results. Sufficient amounts of standard solutions with known concentrations of Sc and In were added and dilution with water was made to a 50 g producing solution for ICPMS analysis. Common standard elements, blanks, and the sample solution were then introduced to an Agilent 7500cx Inductively Coupled Plasma-Mass Spectrometer (ICP-MP). The concentrations of the approximately 50 elements in the sample solution were quantitatively determined. All gases, C, S, and Si cannot be analyzed by ICP-MS. Sc and In could not be analyzed, either, since these 2 elements were utilized as standards.

The obtained Sample 1 was evaluated for IQE measurement, and further characterized by ICP-MS for trace element analysis. The obtained IQE value as well as ICP-MS data were also used to compare with other samples together.

Example 2

Preparation and Evaluation of Emissive Ceramic Sample 2

The urea homogeneous precipitation method was as follows. The yttrium, aluminum, and cerium stock solution was prepared by mixing yttrium chloride ($YCl_3$), aluminum chloride ($AlCl_3$), and cerium chloride ($CeCl_3$) solution and adding concentrated sulfuric acid ($H_2SO_4$). 3.5928 mol $YCl_3$ (99.9% purity, VWR) and 0.0072 mol $CeCl_3$ (99.9% purity, Aldrich) were accurately weighed inside a glove box under nitrogen atmosphere to ensure that no moisture absorption causes an error in the stoichiometric mixing ratio of Y:Ce:Al of final 0.2 at % Ce-doped yttrium aluminum garnet (YAG:Ce) particles. A tiny amount of both chloride powders were slowly added to 3.6 L de-ionized water at each time with constant stirring in order to avoid instant water boiling caused by the violent hydrolysis. 6.0 mol $AlCl_3$ (>99.9% purity, Aldrich) was also accurately weighed inside glove box under nitrogen atmosphere weighed, and it was dissolved into the separate 6.0 L de-ionized water in the same manner. These two aqueous solutions were then mixed in a 40 L Erlenmeyer flask with constant stirring. The two containers for the $YCl_3$/$CeCl_3$ and for the $AlCl_3$ solutions were rinsed thoroughly with de-ionized water and the rinsing water was combined into the 40 L flask to ensure quantitative transfer and mixing of the metal chlorides solution. 0.4 L of 36N concentrated sulfuric acid ($H_2SO_4$, 95-98% purity, Aldrich) was then slowly added to the mixed solution to form the yttrium, aluminum, and cerium stock solution with constant stirring.

Afterwards, approximately 12 L of saturated aqueous solution of ammonium bicarbonate ($NH_4HCO_3$, 99% purity, Aldrich) was added, drop wise, into the stock solution until the pH of the solution became about 4.8. This resultant solution containing white precipitates was continuously stirred overnight at room temperature. Then ammonium hydroxide solution ($NH_4OH$, 29-30% as $NH_3$, Aldrich) was added drop-wise into the mixed solution until pH became 7.8. The resultant solution was stirred for about an additional 2 hours. Finally, the solution was filtered to collect white solid with vacuum filtration. The collected white solid was repeatedly washed with de-ionized water for 6 times with vacuum filtration. The washed white solid was then dried at about 120° C. for about 48 hours to obtain YAG precursor particles. BET surface area of the precursor particles was measured by a BET surface area analyzer (Gemini V, Micromeritics Instrument Corporation, Norcross Ga.) to be 40.3 $m^2$/g. Amorphous structure of the precursor particles was confirmed by X-ray diffraction (XRD) technique. The YAG:Ce precursor particles were calcined in air for about 2 h at about 1300° to obtain YAG crystal particles. BET surface area of the YAG crystal particles was measured to be 1.7 $m^2$/g. Only YAG crystal structure of the calcinated particles was detected by XRD.

Sample 2 was prepared and evaluated in a similar manner as described in Example 1, except that, the YAG particles synthesized by the above urea homogeneous precipitation method were used to replace the YAG particles synthesized by RF thermal plasma pyrolysis described in Example 1.

Example 3

Preparation and Evaluation of Emissive Ceramic Sample 3

Sample 3 was prepared and evaluated in a similar manner to Sample 1 in Example 1, except that 54.72 g $Y_2O_3$ particles (denoted as $Y_2O_3$ powder 3), 41.26 g $Al_2O_3$ particles with a BET surface area of 5.58+/−0.11 $m^2$/g, 167 mg $CeO_2$ particles with a BET surface area of 5.41+/−0.10 $m^2$/g, 16.20 g aqueous acrylic polymer solution as a main component of polymeric binder for final green sheet, 0.18 g 2,4,7,9-tetramethyl-5-decyne-4,7-diol ethoxylate as a defoamer for aqueous slurry, 1.79 g 2-amino-2-methyl-1 propanol as a plasticizer, and 45.00 g milli-Q water were added to a 12 oz (0.341)

polypropylene (PP) thick wall jar, whose inner diameter is 80 mm (Parkway Plastics Inc., Piscataway, N.J.), for aqueous slurry preparation. The $Y_2O_3$ particles were calcinated at 1400° C. in air to have the desired particle size before this slurry preparation. After the calcinations, the BET surface area of the $Y_2O_3$ particles was measured to be approximately 2.8 m²/g. Obtained $D_{ave}$ of the calcinated $Y_2O_3$ particles was 428 nm based on 5.01 g/cc of the Y2O3 density. 570 g $ZrO_2$ milling media of 5~10 mm diameter were added to the PP jar. After ball-milling for the initial 16 hours, additional 20.70 g of the same aqueous acrylic polymer solution was added to the milled solution of ceramic particles in the PP jar to finally contain 60 vol % ceramic particles in the final slurry. 0.2 at % Ce-doped YAG ceramics was obtained after the end of sintering at 1800° C. in vacuum.

Examples 4-11

Preparation and Evaluation of Emissive Ceramic Samples 4-11

Samples 4-11 were prepared and evaluated in a similar manner to Sample 3 in Example 3, except that each different $Y_2O_3$ particles (denoted as $Y_2O_3$ powders 4-11) were used to replace $Y_2O_3$ powder 3. $Y_2O_3$ particles 4-11 were used with adjusted surface area to the similar the value as $Y_2O_3$ powder 3 in Example 3.

Example 12

Preparation and Evaluation of Emissive Ceramic Sample 12

Sample 12 was prepared and evaluated in a similar manner to Samples 1 in Example 1, except that a layer of 100 micron thick green sheet in Example 2 and three layers of 100 micron thick green sheet in Example 3 were laminated together with the green sheet from Example 2 sandwiched between three green sheets from Example 3. Ceramic Sample 12 was obtained after sintering at 1800° C. in vacuum, followed by annealing at 1400° C. in low vacuum.

Results for Samples 1-12

TABLE 1

IQE for emissive YAG ceramic Samples 1-12

| Sample | IQE |
|---|---|
| 1 | 82% |
| 2 | 32% |
| 3 | 99% |
| 4 | 84% |
| 5 | 98% |
| 6 | 82% |
| 7 | 67% |
| 8 | 83% |
| 9 | 85% |
| 10 | 91% |
| 11 | 85% |
| 12 | 73% |

ICP-MS based trace elements from Samples 1-12 are provided in TABLE 2. All values provided in TABLE 2 except ceramic purity (presented in weight percent) are in parts per million (ppm) in weight.

TABLE 2

ICP-MS Analysis of sintered YAG ceramics from Samples 1-12

| | Purity (%) | | | | | | | | | | | | |
|---|---|---|---|---|---|---|---|---|---|---|---|---|---|
| Sample | 99.89 1 | 99.64 2 | 99.93 3 | 99.91 4 | 99.94 5 | 99.89 6 | 99.81 7 | 99.93 8 | 99.93 9 | 99.93 10 | 99.94 11 | 99.85 12 | Detection Limit |
| Be | ND | ND | ND | ND | ND | ND | ND | ND | ND | ND | ND | ND | 0.01~0.05 |
| B | ND | 33 | ND | ND | ND | ND | ND | 1.0 | ND | ND | ND | 9.5 | 1~9 |
| Na | 68 | 555 | ND | ND | ND | 85 | ND | 68 | ND | ND | ND | 159 | 9~100 |
| Mg | 5 | 2000 | ND | 24 | ND | 48 | ND | ND | ND | ND | ND | 580 | 1~20 |
| P | ND | ND | ND | ND | ND | 120 | 114 | ND | ND | ND | ND | ND | 7~10 |
| K | ND | ND | ND | ND | ND | 55 | ND | ND | ND | ND | ND | ND | 20~50 |
| Ca | 384 | 285 | 52 | 99 | 44 | 175 | 888 | 44 | 44 | 44 | 44 | 118 | 10~100 |
| Ti | 0.9 | 18 | 0.9 | 29 | 0.9 | 0.9 | 2.7 | 0.9 | 0.9 | 0.9 | 0.9 | 6.0 | 0.1~0.6 |
| V | ND | 1.6 | ND | ND | ND | ND | 0.7 | ND | ND | ND | ND | 0.5 | 0.05~0.3 |
| Cr | 2.8 | 3.7 | 0.4 | 0.5 | ND | 1.0 | 5.1 | 0.1 | ND | ND | ND | 1.4 | 0.06~0.2 |
| Mn | 1.1 | 2.0 | 0.1 | 0.2 | ND | 0.2 | 1.1 | ND | ND | ND | ND | 0.6 | 0.01~0.06 |
| Fe | 22 | 82 | 5.9 | 7.6 | 5.9 | 17 | 33 | 5.9 | 5.9 | 5.9 | 8.6 | 28 | 0.7~4 |
| Co | ND | ND | ND | ND | ND | ND | 0.1 | ND | ND | ND | ND | ND | 0.01~0.03 |
| Ni | 0.9 | 1.4 | 0.1 | 0.2 | ND | 0.4 | 2.9 | ND | ND | ND | ND | 0.5 | 0.03~0.09 |
| Cu | 1.6 | 1.6 | 0.4 | 2.0 | 0.4 | 0.4 | 0.7 | 0.4 | 0.4 | 0.4 | 0.4 | 0.8 | 0.04~0.2 |
| Zn | 0.6 | 11 | 0.9 | 2.3 | ND | 1.7 | 1.4 | 1.0 | 0.9 | 0.9 | 2.0 | 3.8 | 0.09~0.5 |
| Ga | 3.4 | 2.3 | 0.8 | 13 | 0.8 | 0.8 | 0.9 | 0.8 | 0.8 | 0.8 | 0.8 | 1.2 | 0.01~0.06 |
| Ge | 0.1 | ND | ND | ND | ND | 0.1 | 0.1 | ND | ND | ND | ND | ND | 0.02~0.2 |
| As | ND | ND | ND | ND | ND | ND | ND | ND | ND | 0.1 | ND | ND | 0.06~0.1 |
| Se | ND | ND | ND | ND | ND | 1.0 | ND | 1.0 | ND | 0.7 | ND | ND | 0.7~3 |
| Rb | 0.2 | ND | ND | ND | ND | ND | 0.1 | ND | ND | ND | ND | ND | 0.01~0.05 |
| Sr | 0.4 | ND | 0.1 | 0.3 | 0.1 | 0.6 | ND | 0.1 | ND | ND | ND | 0.1 | 0.06~1 |
| Zr | 500 | 540 | 530 | 610 | 450 | 500 | 770 | 530 | 560 | 550 | 530 | 520 | 0.01~0.4 |
| Nb | ND | 1.0 | ND | 0.8 | ND | ND | 0.1 | ND | ND | ND | ND | 0.3 | 0.01~0.1 |
| Mo | 24 | 27 | 24 | 24 | 24 | 24 | 26 | 24 | 24 | 24 | 24 | 25 | 0.04~0.09 |
| Pd | 0.1 | ND | 0.4 | 0.4 | 0.2 | 0.2 | 0.5 | 0.2 | 0.2 | 0.2 | 0.2 | 0.3 | 0.01~0.2 |
| Ag | ND | ND | ND | ND | ND | ND | ND | ND | ND | ND | ND | ND | 0.01~0.04 |
| Cd | 0.1 | ND | 0.1 | 0.1 | ND | ND | ND | ND | ND | ND | ND | ND | 0.01~0.04 |
| Sn | 0.9 | ND | 3.6 | 4.1 | ND | 0.1 | 5.0 | ND | ND | ND | ND | 2.5 | 0.01~0.1 |
| Sb | 3.5 | ND | ND | ND | ND | 0.2 | 0.4 | ND | ND | ND | ND | ND | 0.01~0.08 |
| Te | ND | ND | ND | ND | ND | ND | 1.6 | ND | ND | ND | ND | ND | 0.09~0.4 |

TABLE 2-continued

ICP-MS Analysis of sintered YAG ceramics from Samples 1-12

Purity (%)

| Sample | 99.89 1 | 99.64 2 | 99.93 3 | 99.91 4 | 99.94 5 | 99.89 6 | 99.81 7 | 99.93 8 | 99.93 9 | 99.93 10 | 99.94 11 | 99.85 12 | Detection Limit |
|---|---|---|---|---|---|---|---|---|---|---|---|---|---|
| Ba | 0.3 | 0.4 | 0.4 | 75 | ND | 0.5 | 0.7 | 0.1 | ND | ND | 0.1 | 0.4 | 0.01~0.3 |
| La | 2.4 | 0.2 | 0.1 | 0.1 | ND | 18 | 0.8 | ND | ND | ND | ND | 0.2 | 0.01~0.08 |
| Pr | 0.3 | ND | 0.1 | 0.1 | ND | 0.1 | 0.4 | 0.1 | ND | 0.1 | ND | 0.1 | 0.01 |
| Nd | 1.0 | 0.2 | 0.2 | 0.8 | ND | 0.2 | 0.9 | 0.1 | 0.1 | 0.9 | ND | 0.2 | 0.01 |
| Sm | 1.0 | ND | ND | ND | ND | 0.2 | 1.3 | ND | 0.1 | 0.1 | ND | ND | 0.01 |
| Eu | 0.4 | ND | ND | 0.1 | ND | ND | ND | 0.1 | 0.1 | 0.2 | 2.3 | ND | 0.01 |
| Tb | 0.3 | 0.2 | 0.1 | 0.1 | 0.1 | 0.1 | 0.1 | 0.4 | 0.1 | 0.2 | 0.1 | 0.1 | 0.01 |
| Dy | 0.5 | ND | 0.2 | 0.4 | 0.1 | 0.1 | 0.2 | 0.3 | 0.2 | 0.9 | ND | 0.1 | 0.01 |
| Ho | 4.6 | 0.2 | 0.2 | 0.3 | ND | 1.7 | 2.5 | 0.1 | 0.3 | 0.2 | 0.6 | 0.2 | 0.01 |
| Er | 13 | ND | 0.1 | 0.3 | ND | 0.2 | 0.2 | 0.2 | ND | 0.4 | 0.1 | 0.1 | 0.01 |
| Tm | 0.6 | ND | ND | ND | ND | ND | ND | ND | ND | 0.1 | ND | ND | 0.01 |
| Yb | 2.8 | ND | 0.1 | 0.4 | ND | 0.1 | 0.1 | 0.2 | ND | 0.3 | 0.1 | 0.1 | — |
| Lu | 20 | ND | ND | ND | ND | ND | 4.2 | ND | ND | ND | ND | ND | 0.01~0.3 |
| Hf | 16 | 16 | 16 | 20 | 16 | 16 | 30 | 16 | 17 | 17 | 16 | 16 | 0.01~0.1 |
| W | 17 | 26 | 17 | 17 | 17 | 17 | 17 | 17 | 17 | 17 | 17 | 20 | 0.01~0.9 |
| Os | ND | ND | ND | ND | ND | ND | ND | ND | ND | ND | ND | ND | 0.03~0.1 |
| Ir | ND | ND | ND | ND | ND | ND | ND | ND | ND | ND | ND | ND | 0.01~0.08 |
| Pt | ND | ND | ND | ND | ND | ND | ND | ND | ND | ND | ND | ND | 0.01~3 |
| Au | ND | ND | ND | ND | ND | ND | ND | ND | ND | ND | ND | ND | 0.02~0.1 |
| Pb | 0.7 | 1.3 | 0.7 | 1.5 | 0.7 | 1.1 | 2.6 | 0.9 | 0.7 | 0.8 | 0.8 | 0.9 | 0.05~0.06 |
| Bi | ND | ND | ND | 1.5 | ND | ND | 0.9 | ND | ND | ND | ND | ND | 0.01 |
| U | ND | ND | ND | 0.4 | ND | ND | 0.1 | ND | ND | ND | ND | ND | 0.01 |

Since the detection limit varied depending on samples, the detection limit in TABLE 2 shows the range from all ICP-MS analyses. ND indicates it is believed that the measured purity is less than the detection limit of the instrument. Elements that were not detected in any of Samples 1-29 or could not be measured using ICP-MS were excluded from TABLE 2. For example, plutonium could not be detected using ICP-MS.

Example 13

Preparation and Evaluation of Emissive Ceramic Sample 13

1.0 at % Ce-doped and 35% Gd added YAG ceramic emissive element was prepared in a similar manner to Example 1, except that 1.0% instead of 0.2% Ce was used as dopant, as well as 35% Gd was added to replaced Y in YAG ceramics were used, and that the toluene-based slurry was prepared instead of an aqueous slurry. Before the mixing for slurry preparation, the $Gd_2O_3$ particles were calcinated at 1200° C. in air to have the desired particle size before this slurry preparation. After the calcinations, the BET surface area of the $Gd_2O_3$ particles was measured to be approximately 2.5 m²/g. The SSR-based 1.0 at % Ce-doped Y/GdAG emissive layer was produced from 9.752 g $Y_2O_3$ particles, 11.466 g $Al_2O_3$ particles, 0.586 g Cerium(III) nitrate hexahydrate (equal to 1.0 at % Ce doping concentration) and 8.561 g $Gd_2O_3$ particles (denoted as $Gd_2O_3$ powder 13). Here, the $Y_2O_3$ powder 3 from Sample 3 was used in all respective layers in this example since this was from the highest IQE samples as set forth in Table 1. These particles were added to high purity $Al_2O_3$ ball mill jar (Torrey Hills Technologies, LLC, San Diego Calif.). 2.00 pph (0.60 g) dispersant (Flowlen G-700, Kyoeisha Chemical Co. Ltd., Japan) and 0.50 pph (0.15 g) tetraethyl orthosilicate (TEOS, Sigma-Aldrich, St. Louis, Mo.) as a sintering aid were also added to the mill jar. 10.0 g toluene was added to the mill jar, and the contents in the mill jar were then stirred by hand until the mixture seemed liquid-like. 30 g $ZrO_2$ milling media of 3 mm diameter were added to the mill jar, and the mixture in the mill jar was milled by bench-top planetary ball mill (MTI Corporation, Richmond Calif.) for 24 hours as a first mixing step.

Concurrently, a binder solution of polymeric binder and plasticizers was prepared by dissolving 21.00 g poly(vinyl butyral-co-vinyl alcohol-co-vinyl acetate) (PVB, Sigma-Aldrich, St. Louis, Mo.), 10.50 g benzyl n-butyl phthalate (BBP, Alfa Aesar), and 10.50 g polyethylene glycol (PEG, Sigma-Aldrich, St. Louis, Mo.) in 90 g toluene while stirring all for about 24 hrs.

14.14 g binder solution prepared as above was added to the milled solution of ceramic particles in the mill jar to contain 7.50 pph PVB, 3.75 pph BBP, and 3.75 pph PEG in the final slurry. Then this mixture was further ball-milled by the bench-top planetary ball mill for about an additional 24 hrs. When the entire ball milling process was completed, the resultant slurry was filtered through a syringe-aided metal screen filter with pore size of 0.05 mm, in order to remove aggregated ceramic particles. The slurry was then cast on a silicone-coated polyethelene tetraphthalate substrate with an adjustable film applicator (Paul N. Gardner Company, Inc., Pompano Beach, Fla.) at a cast rate of 300 mm/min. The blade gap of the film applicator was adjusted depending on the desired green sheet thickness. The cast tape was dried at ambient atmosphere to finally obtain approximately 40 μm thick ceramic green sheet of the 1.0% Ce/35% Gd-dopedgreen sheet for a YAG emissive layer.

The SSR-based Y/GdAG inner dummy layers (without Ce-doping) were also produced from 9.927 g $Y_2O_3$ particles (denoted as $Y_2O_3$ powder 3), 11.493 g $Al_2O_3$ particles, and 8.581 g $Gd_2O_3$ particles (denoted as Gd2O3 powder 13). This resulted in a 35% Gd green sheet for inner dummy layers. The blade gap of the film applicator was adjusted to finally obtain approximately 100 μm thick ceramic green sheet of the inner dummy layers.

The SSR-based YAG outer dummy layers (without any doping) were also produced from 57.06 g $Y_2O_3$ particles (denoted as $Y_2O_3$ powder 3) and 42.94 g $Al_2O_3$ particles were added to $ZrO_2$ ball mill jar (Torrey Hills Technologies, LLC, San Diego Calif.). 2.00 pph (2.00 g) Flowlen G-700 and 0.50 pph (0.50 g) TEOS as a sintering aid were also added to the mill jar. 33.33 g of toluene was added to the mill jar, and the contents in the mill jar were then stirred by hand until the mixture seemed liquid-like. 130 g of ZrO$_2$ ball of 3 mm diameter were added to the mill jar. After the end of the entire milling process, the blade gap of the film applicator was adjusted to finally obtain approximately 100 μm thick ceramic green sheet of the outer dummy layers.

Figure 5:
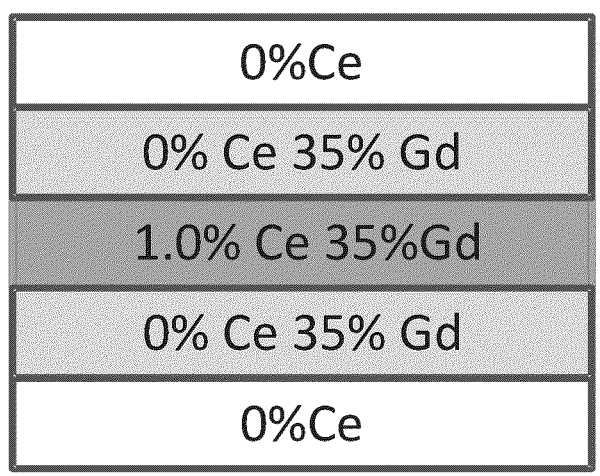
FIG. 5 is an embodiment of the emissive element disclosed herein.

The laminated layer (5 layers) was prepared in a similar manner to Example 1, except that a five layers were laminated and sintered; a first and a last layer of YAG green sheet (without any Ce- and Gd-doping), a second and a forth layer of 35 at % Gd-doped YAG green sheet (without Ce-doping), and a third middle layer of 1.0% Ce/35% Gd-doped green sheet. The structure of the laminate is shown in FIG. 5. This assembly was laminated at 24 MPa at room temperature for about 5 min, followed by 16 MPa at about 85° C. for about 5 min using TBH-100H heating press (Sansho Industry, Japan). As a result, an approximately 35 mm×35 mm×0.44 mm laminated YAG compact was obtained.

IQE and ICP-MS analysis of the obtained Sample 13 was performed in a similar manner to the Sample 1 in Example 1.

Examples 14-19

Preparation and Evaluation of Emissive Ceramic Samples 14-19

Sample 14-19 were prepared and evaluated in a similar manner to Sample 13 in Example 13, except that, different Gd$_2$O$_3$ particles (denoted as Gd$_2$O$_3$ powders 14-19, respectively) were used to replace Gd$_2$O$_3$ particle 13. These Gd$_2$O$_3$ particles 14-19 were used with adjusted surface area to the similar the value as Gd$_2$O$_3$ powder 13 in Example 13.

Results for Samples 13-19

IQE values of Sample 13 to Sample 19 are summarized in TABLE 3.

TABLE 3

IQE for emissive Gd-doped YAG ceramic Samples 13-19

| Sample | IQE |
| --- | --- |
| 13 | 85% |
| 14 | 83% |
| 15 | 86% |
| 16 | 95% |
| 17 | 90% |
| 18 | 95% |
| 19 | 98% |

ICP-MS based trace elements from Sample 13 to Sample 19 are provided in TABLE 4. All values provided in TABLE 4 except ceramic purity are in parts per million (ppm). INT indicates that such elements could not be analyzed due to interference with other elements.

TABLE 4

ICP-MS Analysis of sintered (Y, Gd)AG ceramics from Samples 13-19

| | Purity (%) | | | | | | | |
| --- | --- | --- | --- | --- | --- | --- | --- | --- |
| Sample | 99.93 13 | 99.93 14 | 99.94 15 | 99.94 16 | 99.92 17 | 99.91 18 | 99.93 19 | Detection Limit |
| Be | 0.2 | ND | ND | ND | ND | 0.2 | ND | 0.01~0.05 |
| B | ND | ND | ND | ND | ND | ND | ND | 1~9 |
| Na | ND | ND | ND | ND | 9.0 | ND | ND | 9~100 |
| Mg | ND | ND | ND | 2.7 | ND | 5.0 | ND | 1~20 |
| P | 5.9 | 2.7 | ND | ND | ND | 15 | ND | 7~10 |
| K | ND | ND | ND | ND | ND | ND | ND | 20~50 |
| Ca | 58 | 52 | 52 | 52 | 149 | 169 | 52 | 10~100 |
| Ti | ND | ND | ND | ND | 0.5 | 0.1 | ND | 0.1~0.6 |
| V | ND | ND | ND | ND | ND | ND | ND | 0.05~0.3 |
| Cr | ND | ND | 0.6 | ND | 1.7 | 0.4 | 0.1 | 0.06~0.2 |
| Mn | ND | ND | ND | ND | 0.2 | 0.4 | ND | 0.01~0.06 |
| Fe | ND | ND | ND | ND | 5.0 | 6.6 | ND | 0.7~4 |
| Co | ND | ND | ND | ND | 0.9 | ND | ND | 0.01~0.03 |
| Ni | ND | ND | ND | ND | 0.6 | 0.1 | ND | 0.03~0.09 |
| Cu | 0.4 | 0.4 | 10 | 0.4 | 1.2 | 0.5 | 0.4 | 0.04~0.2 |
| Zn | 0.8 | 0.8 | 0.8 | 0.8 | 30 | 0.8 | 0.8 | 0.09~0.5 |
| Ga | ND | ND | ND | ND | 0.4 | ND | ND | 0.01~0.06 |
| Ge | ND | ND | ND | ND | 0.3 | ND | ND | 0.02~0.2 |
| As | ND | ND | ND | ND | 0.2 | 0.1 | ND | 0.06~0.1 |
| Se | ND | ND | ND | ND | 0.7 | 2.8 | 1.1 | 0.7~3 |
| Rb | ND | ND | ND | ND | ND | ND | ND | 0.01~0.05 |
| Sr | ND | ND | ND | ND | 0.3 | 0.5 | ND | 0.06~1 |
| Zr | 400 | 470 | 440 | 520 | 480 | 500 | 550 | 0.01~0.4 |
| Nb | ND | ND | ND | ND | ND | ND | ND | 0.01~0.1 |
| Mo | 24 | 24 | 24 | 24 | 24 | 24 | 24 | 0.04~0.09 |
| Pd | ND | ND | ND | 0.6 | 0.2 | ND | ND | 0.01~0.2 |
| Ag | ND | ND | ND | ND | 0.5 | ND | ND | 0.01~0.04 |
| Cd | ND | ND | ND | ND | ND | ND | ND | 0.01~0.04 |
| Sn | ND | ND | ND | ND | 0.1 | ND | ND | 0.01~0.1 |
| Sb | ND | ND | ND | ND | ND | ND | ND | 0.01~0.08 |
| Te | ND | ND | ND | ND | ND | 0.1 | ND | 0.09~0.4 |
| Ba | ND | ND | ND | ND | 3.9 | 0.4 | ND | 0.01~0.3 |
| La | 25 | 34 | ND | ND | 12 | 0.4 | 0.7 | 0.01~0.08 |
| Pr | ND | ND | ND | ND | 0.8 | 0.1 | 0.2 | 0.01 |
| Nd | ND | ND | 0.2 | 0.2 | 4.8 | 0.5 | 0.2 | 0.01 |
| Sm | ND | 3.6 | 1.5 | ND | 1.0 | 0.3 | 0.2 | 0.01 |
| Eu | 30 | 30 | 0.3 | 0.5 | 5.1 | 94 | 0.5 | 0.01 |
| Tb | 80 | 6.2 | ND | 2.3 | 0.4 | 0.3 | 0.01 |
| Dy | ND | ND | 7.0 | ND | 0.2 | 0.9 | 0.2 | 0.01 |
| Ho | ND | ND | ND | ND | ND | 1.0 | ND | 0.01 |
| Er | ND | ND | ND | ND | 0.1 | 0.2 | 0.1 | 0.01 |
| Tm | ND | ND | ND | ND | 0.1 | 0.3 | 0.1 | 0.01 |
| Yb | INT | INT | INT | INT | INT | INT | INT | — |
| Lu | 23 | 31 | INT | INT | INT | INT | INT | 0.01~0.3 |
| Hf | 19 | 20 | 16 | 16 | 16 | 16 | 16 | 0.01~0.1 |
| W | 17 | 17 | 17 | 17 | 28 | 17 | 17 | 0.01~0.9 |
| Os | 0.3 | 0.2 | 0.2 | ND | ND | ND | ND | 0.03~0.1 |
| Ir | ND | ND | ND | ND | 0.1 | 0.1 | 0.1 | 0.01~0.08 |
| Pt | ND | ND | ND | ND | 1.7 | ND | ND | 0.01~3 |
| Au | ND | ND | ND | ND | ND | ND | ND | 0.02~0.1 |
| Pb | 0.6 | 0.6 | 0.6 | 0.6 | 3.4 | 0.9 | 0.6 | 0.05~0.06 |
| Bi | ND | ND | ND | ND | ND | ND | ND | 0.01 |
| U | ND | ND | ND | ND | 0.1 | ND | ND | 0.01 |

Example 20

Preparation and Evaluation of Emissive Ceramic Sample 20

Sample 20 was prepared and evaluated in a similar manner to Sample 3 in Example 3, except that 31.89 g Y$_2$O$_3$ particles (denoted as Y$_2$O$_3$ powder 3), 26.78 g Al$_2$O$_3$ particles with a BET surface area of 5.58+/−0.11 m$^2$/g, 5.71 g Gd$_2$O$_3$ particles (denoted as Gd$_2$O$_3$ powder 18, equals to 10 at % Gd doping concentration), 217 mg CeO$_2$ particles with a BET surface area of 5.41+/−0.10 m$^2$/g (equals to 0.4 at % Ce doping concentration), 10.80 g aqueous acrylic polymer solution, 0.12 g defoamer, 1.17 g plasticizer, and 30.00 g milli-Q water were added to 8 oz (0.231) PP thick wall jar, whose inner diameter is 80 mm (Parkway Plastics Inc., Piscataway, N.J.), for aqueous slurry preparation. Here, the $Y_2O_3$ powder 3 from Sample 3 and the $Gd_2O_3$ powder 18 from Sample 18 were used in this example since these showed one of the highest IQE samples in Tables 1 and 3. Before the mixing for slurry preparation, the $Gd_2O_3$ powder 18 were calcinated at 1200° C. in air to have the desired particle size before this slurry preparation. After the calcinations, the BET surface area of the $Gd_2O_3$ particles was measured to be approximately 2.0 $m^2/g$. 380 g $ZrO_2$ milling media of 5~10 mm diameter were added to the PP jar. After ball-milling for the initial 16 hours, additional 13.33 g of the same aqueous acrylic polymer solution was added to the milled solution of ceramic particles in the PP jar to finally contain 60 vol % ceramic particles in the final slurry. 0.4 at % Ce- and 10 at % Gd-doped doped YAG ceramics was obtained after the end of sintering at 1800° C. in vacuum.

Examples 21-25

Preparation and Evaluation of Emissive Ceramic Samples 21-25

Sample 21-Sample 25 were prepared and evaluated in a similar manner to Sample 20 in Example 20, except that, different $Gd_2O_3$ particles (denoted as $Gd_2O_3$ powders 21-25, respectively) were used to replace $Gd_2O_3$ powder 18. These $Gd_2O_3$ particles 21-25 were used with adjusted surface area to the similar the value as $Gd_2O_3$ powder 18 in Example 20.

IQE values of Sample 20 to Sample 25 are summarized in Table 5.

TABLE 5

IQE for emissive Gd-doped YAG ceramic Samples 20-25

| Sample | IQE |
|---|---|
| 20 | 99% |
| 21 | 99% |
| 22 | 91% |
| 23 | 90% |
| 24 | 87% |
| 25 | 84% |

ICP-MS based trace elements from Samples 20-25 are provided in TABLE 6. All values provided in TABLE 6 except ceramic purity are in parts per million (ppm).

TABLE 6

ICP-MS Analysis of sintered YAG ceramics from Samples 20-25

| | Purity (%) | | | | | | |
|---|---|---|---|---|---|---|---|
| Sample | 99.92 20 | 99.89 21 | 99.94 22 | 99.94 23 | 99.94 24 | 99.94 25 | Detection Limit |
| Be | 0.1 | 0.1 | ND | ND | ND | ND | 0.01~0.05 |
| B | ND | ND | ND | ND | ND | ND | 1~9 |
| Na | ND | ND | ND | ND | ND | ND | 9~100 |
| Mg | 2.8 | ND | ND | ND | ND | ND | 1~20 |
| P | 8.7 | ND | ND | ND | ND | ND | 7~10 |
| K | ND | ND | ND | ND | ND | ND | 20~50 |
| Ca | 117 | 735 | 64 | 51 | 56 | 51 | 10~100 |
| Ti | 0.1 | 0.4 | ND | ND | ND | ND | 0.1~0.6 |
| V | ND | ND | ND | ND | ND | ND | 0.05~0.3 |
| Cr | 0.2 | 1.0 | ND | ND | ND | ND | 0.06~0.2 |
| Mn | 0.2 | 0.3 | ND | ND | ND | ND | 0.01~0.06 |
| Fe | 3.7 | 7.2 | ND | ND | ND | ND | 0.7~4 |
| Co | ND | ND | ND | ND | ND | ND | 0.01~0.03 |
| Ni | 0.1 | 0.4 | ND | ND | ND | ND | 0.03~0.09 |

TABLE 6-continued

ICP-MS Analysis of sintered YAG ceramics from Samples 20-25

| | Purity (%) | | | | | | |
|---|---|---|---|---|---|---|---|
| Sample | 99.92 20 | 99.89 21 | 99.94 22 | 99.94 23 | 99.94 24 | 99.94 25 | Detection Limit |
| Cu | 0.5 | 1.0 | 0.4 | 0.4 | 0.4 | 0.4 | 0.04~0.2 |
| Zn | 0.9 | 0.8 | 0.9 | 2.0 | 1.2 | 1.0 | 0.09~0.5 |
| Ga | ND | 1.3 | ND | ND | ND | ND | 0.01~0.06 |
| Ge | ND | ND | ND | ND | ND | ND | 0.02~0.2 |
| As | ND | ND | ND | 0.1 | ND | ND | 0.06~0.1 |
| Se | 1.6 | ND | ND | ND | ND | ND | 0.7~3 |
| Rb | ND | ND | ND | ND | ND | ND | 0.01~0.05 |
| Sr | 0.3 | ND | ND | ND | 0.1 | ND | 0.06~1 |
| Zr | 530 | 268 | 470 | 430 | 450 | 500 | 0.01~0.4 |
| Nb | ND | ND | ND | ND | ND | ND | 0.01~0.1 |
| Mo | 24 | 24 | 24 | 24 | 24 | 24 | 0.04~0.09 |
| Pd | ND | 0.3 | ND | ND | ND | ND | 0.01~0.2 |
| Ag | ND | ND | ND | ND | ND | ND | 0.01~0.04 |
| Cd | ND | ND | ND | ND | ND | ND | 0.01~0.04 |
| Sn | ND | ND | ND | ND | ND | ND | 0.01~0.1 |
| Sb | ND | ND | ND | ND | 19 | ND | 0.01~0.08 |
| Te | ND | ND | ND | ND | ND | ND | 0.09~0.4 |
| Ba | 0.2 | 0.7 | ND | 0.1 | ND | ND | 0.01~0.3 |
| La | 0.2 | 0.4 | ND | 1.5 | ND | ND | 0.01~0.08 |
| Pr | 0.1 | 0.2 | ND | 0.2 | ND | ND | 0.01 |
| Nd | 0.3 | 0.5 | ND | 1.4 | ND | ND | 0.01 |
| Sm | 0.2 | 0.2 | ND | ND | ND | ND | 0.01 |
| Eu | 53 | 56 | 0.1 | 1.2 | ND | ND | 0.01 |
| Tb | 0.3 | 0.3 | 0.4 | 3.6 | 0.3 | 0.3 | 0.01 |
| Dy | 0.5 | 0.6 | 0.1 | 5.2 | ND | ND | 0.01 |
| Ho | 0.5 | 0.7 | ND | 6.8 | ND | ND | 0.01 |
| Er | 0.1 | 0.3 | 0.3 | 0.3 | ND | ND | 0.01 |
| Tm | 0.2 | 0.2 | ND | 0.2 | ND | ND | 0.01 |
| Yb | INT | INT | INT | INT | INT | INT | — |
| Lu | INT | 7.7 | INT | 6.3 | INT | INT | 0.01~0.3 |
| Hf | 16 | 10 | 16 | 16 | 16 | 16 | 0.01~0.1 |
| W | 17 | 17 | 17 | 17 | 17 | 17 | 0.01~0.9 |
| Os | ND | ND | ND | ND | ND | ND | 0.03~0.1 |
| Ir | ND | ND | 0.1 | ND | ND | ND | 0.01~0.08 |
| Pt | ND | ND | ND | ND | ND | ND | 0.01~3 |
| Au | ND | ND | ND | ND | ND | ND | 0.02~0.1 |
| Pb | 0.9 | 0.9 | 0.8 | 0.7 | 0.7 | 0.7 | 0.05~0.06 |
| Bi | ND | ND | ND | ND | ND | ND | 0.01 |
| U | ND | ND | ND | ND | ND | ND | 0.01 |

Example 26

Preparation and Evaluation of Emissive Ceramic Sample 26

Sample 26 was prepared and evaluated in a similar manner to Sample 20 in Example 20, except that 29.80 g $Y_2O_3$ particles (denoted as $Y_2O_3$ powder 3), 26.45 g $Al_2O_3$ particles with a BET surface area of 5.58+/−0.11 $m^2/g$, 8.46 g $Gd_2O_3$ particles (denoted as $Gd_2O_3$ powder 18, equal to 15 at % Gd doping concentration), 107 mg $CeO_2$ particles with a BET surface area of 5.41+/−0.10 $m^2/g$ (equals to 0.2 at % Ce doping concentration), 10.80 g aqueous acrylic polymer solution, 0.12 g defoamer, 1.16 g plasticizer, and 30.00 g milli-Q water were added to 8 oz (0.231) PP thick wall jar, whose inner diameter is 80 mm (Parkway Plastics Inc., Piscataway, N.J.), for aqueous slurry preparation. After ball-milling for the initial 16 hours, additional 13.11 g of the same aqueous acrylic solution was added to the milled solution of ceramic particles in the PP jar. 0.2 at % Ce- and 15 at % Gd-doped doped YAG ceramics was obtained after the end of sintering at 1800° C. in vacuum.

Example 27

Preparation and Evaluation of Emissive Ceramic Sample 27

Sample 27 was prepared and evaluated in a similar manner to Sample 26 in Example 26, except that 0.5 pph (0.32 g) zirconium (IV) oxynitrate hydrate (Sigma-Aldrich, St. Louis, Mo.) was added to intentionally add zirconium as a culprit element to see its influence on IQE of final ceramics.

Example 28

Preparation and Evaluation of Emissive Ceramic Sample 28

Sample 28 was prepared and evaluated in a similar manner to Sample 26 in Example 26, except that two layers of 100 micron thick green sheet in Example 26 and two layers of 100 micron thick green sheet in Example 27 were laminated together with different layers being alternated. Thus, Sample 28 includes about half the amount of zirconium as Sample 27. Sample 28 was finally obtained after sintering at 1800° C. in vacuum, followed by annealing at 1400° C. in low vacuum.

Example 29

Preparation and Evaluation of Emissive Ceramic Sample 29

Sample 29 was prepared and evaluated in a similar manner to Sample 26 in Example 26, except that 21.59 g $Y_2O_3$ particles (denoted as Y2O3 powder 3), 25.15 g $Al_2O_3$ particles with a BET surface area of 5.58+/−0.11 m²/g, 18.78 g $Gd_2O_3$ particles (denoted as $Gd_2O_3$ powder 18, equals to 35 at % Gd doping concentration), 204 mg $CeO_2$ particles with a BET surface area of 5.41+/−0.10 m²/g (equals to 0.4 at % Ce doping concentration), 10.80 g aqueous acrylic polymer solution, 0.11 g defoamer, 1.12 g plasticizer, and 30.00 g milli-Q water were added to 8 oz (0.231) PP thick wall jar, whose inner diameter is 80 mm (Parkway Plastics Inc., Piscataway, N.J.), for aqueous slurry preparation. After ball-milling for the initial 16 hours, additional 12.26 g the same aqueous acrylic polymer solution was added to the milled solution of ceramic particles in the PP jar. 0.4 at % Ce- and 35 at % Gd-doped doped YAG ceramics was obtained after the end of sintering at 1800° C. in vacuum.

IQE values of Samples 26-29 are summarized in TABLE 7.

TABLE 7

IQE for emissive Gd-doped YAG ceramic Samples 26-29.

| Sample | IQE |
|---|---|
| 26 | 97% |
| 27 | 75% |
| 28 | 89% |
| 29 | 91% |

ICP-MS based trace elements from Samples 26-29 are provided in TABLE 8. All values provided in TABLE 8 except ceramic purity are in parts per million (ppm).

TABLE 8

ICP-MS Analysis of sintered Gd-doped YAG ceramics from Samples 26-29

| | Purity (%) | | | | |
|---|---|---|---|---|---|
| | 99.92 | 99.42 | 99.67 | 99.43 | |
| | Sample | | | | Detection |
| | 26 | 27 | 28 | 29 | Limit |
| Be | 0.2 | 0.2 | 0.1 | 0.4 | 0.01~0.05 |
| B | ND | ND | ND | 1.0 | 1~9 |
| Na | ND | ND | ND | 14 | 9~100 |
| Mg | 4.2 | 4.3 | 2.2 | 9.1 | 1~20 |
| P | 13 | 13 | ND | 28 | 7~10 |
| K | ND | ND | ND | ND | 20~50 |
| Ca | 149 | 152 | 103 | 265 | 10~100 |
| Ti | 0.1 | 0.6 | 0.8 | 0.2 | 0.1~0.6 |
| V | ND | ND | ND | ND | 0.05~0.3 |
| Cr | 0.3 | 0.5 | 0.5 | 0.7 | 0.06~0.2 |
| Mn | 0.3 | 0.4 | 0.2 | 0.7 | 0.01~0.06 |
| Fe | 5.5 | 8.7 | 7.3 | 12 | 0.7~4 |
| Co | ND | ND | ND | ND | 0.01~0.03 |
| Ni | 0.1 | 0.2 | 0.1 | 0.2 | 0.03~0.09 |
| Cu | 0.5 | 0.5 | 0.5 | 0.6 | 0.04~0.2 |
| Zn | 0.8 | 0.8 | 0.8 | 0.6 | 0.09~0.5 |
| Ga | ND | 0.5 | 0.6 | 0.1 | 0.01~0.06 |
| Ge | ND | ND | ND | 0.1 | 0.02~0.2 |
| As | 0.1 | 0.1 | ND | 0.2 | 0.06~0.1 |
| Se | 2.4 | 2.4 | 1.2 | 5.1 | 0.7~3 |
| Rb | ND | ND | ND | ND | 0.01~0.05 |
| Sr | 0.4 | 0.5 | 0.3 | 0.8 | 0.06~1 |
| Zr | 500 | 2600 | 1600 | 500 | 0.01~0.4 |
| Nb | ND | ND | ND | ND | 0.01~0.1 |
| Mo | 24 | 24 | 24 | 24 | 0.04~0.09 |
| Pd | ND | 0.2 | 0.3 | ND | 0.01~0.2 |
| Ag | ND | ND | ND | ND | 0.01~0.04 |
| Cd | ND | ND | ND | ND | 0.01~0.04 |
| Sn | ND | 1.9 | 2.7 | ND | 0.01~0.1 |
| Sb | ND | ND | ND | 0.1 | 0.01~0.08 |
| Te | 0.1 | 0.1 | ND | 0.1 | 0.09~0.4 |
| Ba | 0.3 | 0.5 | 0.5 | 0.7 | 0.01~0.3 |
| La | 0.3 | 0.4 | 0.3 | 0.7 | 0.01~0.08 |
| Pr | 0.1 | 0.1 | 0.1 | 0.2 | 0.01 |
| Nd | 0.4 | 0.5 | 0.4 | 1.0 | 0.01 |
| Sm | 0.3 | 0.3 | 0.2 | 0.6 | 0.01 |
| Eu | 78 | 80 | 41 | 171 | 0.01 |
| Tb | 0.3 | 0.4 | 0.2 | 0.8 | 0.01 |
| Dy | 0.7 | 0.8 | 0.5 | 1.6 | 0.01 |
| Ho | 0.8 | 0.9 | 0.6 | 1.7 | 0.01 |
| Er | 0.2 | 0.3 | 0.2 | 0.5 | 0.01 |
| Tm | 0.3 | 0.3 | 0.2 | 0.6 | 0.01 |
| Yb | INT | INT | INT | INT | — |
| Lu | INT | INT | INT | INT | — |
| Hf | 16.3 | 16.4 | 16.3 | 17 | 0.01~0.1 |
| W | 17.1 | 17.2 | 17.2 | 17 | 0.01~0.9 |
| Os | ND | ND | ND | ND | 0.03~0.1 |
| Ir | 0.1 | 0.1 | ND | 0.1 | 0.01~0.08 |
| Pt | ND | ND | ND | ND | 0.01~3 |
| Au | ND | ND | ND | 0.1 | 0.02~0.1 |
| Pb | 0.9 | 0.9 | 0.8 | 1.1 | 0.05~0.06 |
| Bi | ND | ND | ND | ND | 0.01 |
| U | ND | ND | ND | ND | 0.01 |

Figure 6:
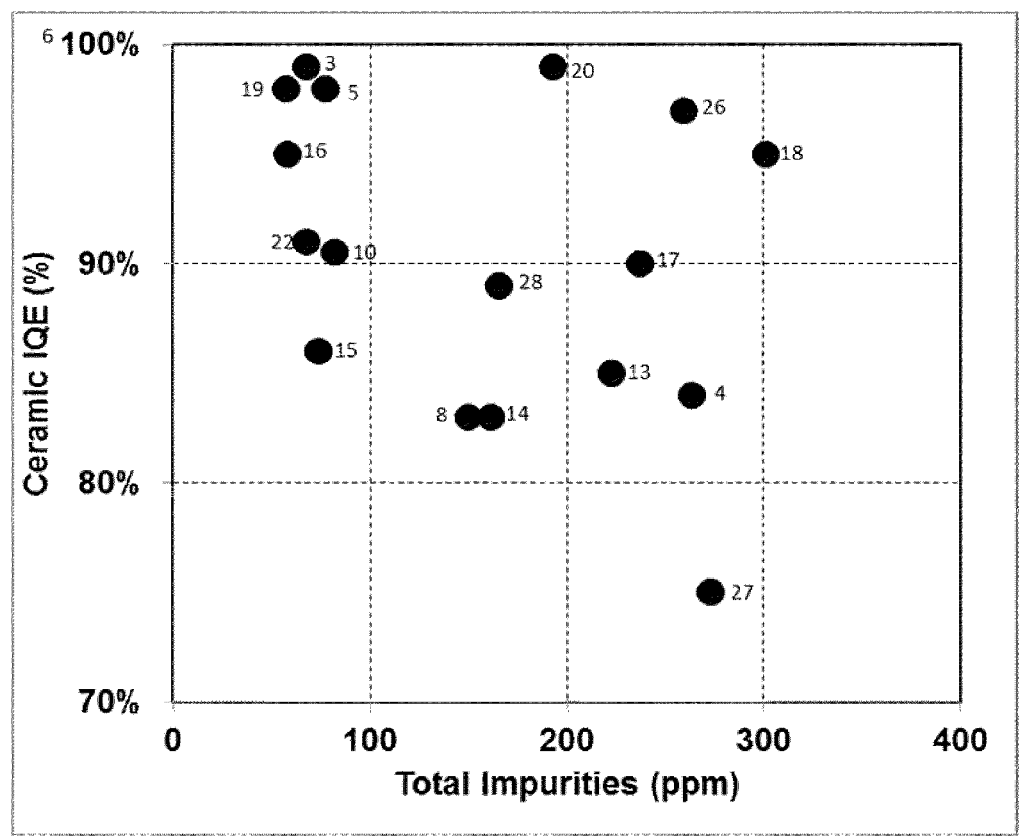
FIG. 6 is a graph depicting IQE values as a function of total impurities within Samples 1-29 from Examples 1-29. The total impurities include all impurities listed in TABLES 1-8 except Zr, Mo, Hf, and W. The x-axis does not extend beyond 400 ppm, and therefore samples having greater than 400 ppm of total impurities are not shown.
Figure 7:
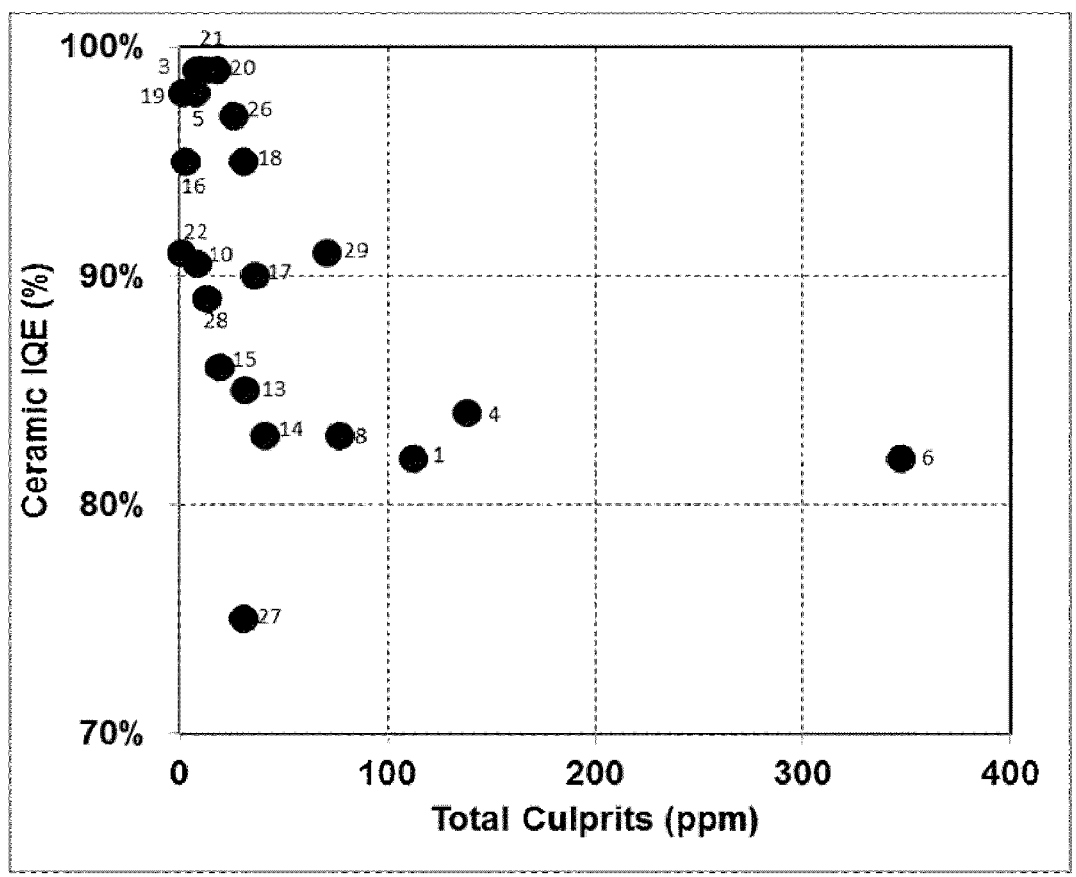
FIG. 7 is a graph depicting IQE values as a function of the total amount of B, Na, Mg, P, K, Ti, Cr, Fe, Cu, Sb, Ba, La, Sm, Dy, Ho, and Pt ("culprits") within Samples 1-29 from Examples 1-29. The x-axis does not extend beyond 400 ppm, and therefore samples having greater than 400 ppm of the listed elements are not shown.

From the data presented in Tables 1-8, it was determined that B, Na, Mg, P, K, Ti, Cr, Fe, Cu, Zr, Sb, Ba, La, Sm, Dy, Ho, and Pt are culprit elements that cause lower IQE in YAG ceramics. FIG. 6 shows the relationship between the total amount of all impurities (except Zr, Mo, Hf, and W) and the IQE of the ceramic samples at IQE >70%. There is no correlation between the total impurity amounts and the IQE. FIG. 7 shows the IQE values as a function of the total amount of all identified culprit elements at IQE >70%. The trend can be seen in FIG. 7 that the IQE decreases as the total amount of identified culprit elements increases.

What is claimed is:

1. An emissive composition comprising:
   a garnet host material;
   an amount of Ce dopant effective to produce luminescence when the emissive composition is exposed to an ultraviolet or blue radiation, and
   an amount of Na in the composition that is less than about 67 ppm.

2. The composition of claim 1, wherein an amount of Mg in the composition is less than about 23 ppm, and an amount of Fe in the composition is less than about 21 ppm.

3. The composition of claim 1, wherein an amount of B in the composition is less than about 9 ppm.

4. The composition of claim 1, an amount of P in the composition is less than about 113 ppm.

5. The composition of claim 1, an amount of K in the composition is less than about 54 ppm.

6. The composition of claim 1, an amount of Ti in the composition is less than about 28 ppm.

7. The composition of claim 1, an amount of Cr in the composition is less than about 2.7 ppm.

8. The composition of claim 1, an amount of Cu in the composition is less than about 1.5 ppm.

9. The composition of claim 1, an amount of Zr in the composition is less than about 1600 ppm.

10. The composition of claim 1, an amount of Sb in the composition is less than about 18 ppm.

11. The composition of claim 1, an amount of Ba in the composition is less than about 74 ppm.

12. The composition of claim 1, an amount of La in the composition is less than about 17 ppm.

13. The composition of claim 1, an amount of Sm in the composition is less than about 1.2 ppm.

14. The composition of claim 1, an amount of Dy in the composition is less than about 6.9 ppm.

15. The composition of claim 1, an amount of Ho in the composition is less than about 7.0 ppm.

16. The composition of claim 1, an amount of Pt in the composition is less than about 2.0 ppm.

17. The composition of claim 1, wherein the garnet host material is represented by the formula: $A_3B^1{}_2B^2{}_3X_{12}$, wherein:
   A is selected from the group consisting of Li, K, Ag, Tl, Ca, Sr, Mn, Co, Cd, Pb, Sc, Y, Pr, Nd, Eu, Gd, Tb, Ho, Er, Tm, Yb, In, Bi, and Zr;
   $B^1$ is selected from Li, Ca, Mn, Co, Ni, Cu, Zn, Cd, Sc, Y, Ho, Er, Tm, Yb, Ti, V, Cr, Mn, Co, Ni, Rh, Al, Ga, In, Ti, Zr, Ru, Sn, Nb, Ta, Sb, and Te;
   $B^2$ is selected from the group consisting of Li, Co, Zn, Cd, Al, Ga, Ti, Si, Ge, Sn, V, Nb, and As; and
   X is selected from the group consisting of O and F.

18. The composition of claim 1, wherein the garnet host material is selected from the group consisting of $Y_3Al_5O_{12}$, $(Y_{1-x}, Gd_x)_3(Al_{1-y}, Ga_y)_5O_{12}$, $Lu_3Al_5O_{12}$, $Tb_3Al_5O_{12}$ and $Ca_3Sc_2Si_3O_{12}$, wherein x is in the range from about 0.00 to about 0.50 and y is in the range from about 0.00 to about 0.50.

19. The composition of claim 1, wherein the garnet host material is $Y_3Al_5O_{12}$.

20. The composition of claim 1, wherein the composition further comprises at least about 20 ppm of Ca or at least about 24 ppm of Mo.

21. A method comprising exposing the composition of claim 1 to a blue or ultraviolet radiation.

22. A lighting apparatus comprising:
   a light source configured to emit blue or ultraviolet radiation; and
   the composition of claim 1, wherein the composition is configured to receive at a least a portion of the blue or ultraviolet radiation.

23. A method of making a emissive ceramic element comprising sintering a composition comprising a garnet host material, or stoichiometric precursors thereof, and Ce-dopant or a precursor thereof,
   wherein an amount of Na in the composition is less than about 67 ppm.

* * * * *